United States Patent
Tanaka et al.

(10) Patent No.: US 10,170,161 B2
(45) Date of Patent: Jan. 1, 2019

(54) SEMICONDUCTOR MEMORY DEVICE AND TEST METHOD THEREFOR

(71) Applicant: Renesas Electronics Corporation, Tokyo (JP)

(72) Inventors: Shinji Tanaka, Tokyo (JP); Yuichiro Ishii, Tokyo (JP); Masaki Tsukude, Tokyo (JP); Yoshikazu Saito, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/782,662

(22) Filed: Oct. 12, 2017

(65) Prior Publication Data
US 2018/0047457 A1    Feb. 15, 2018

Related U.S. Application Data

(62) Division of application No. 15/234,910, filed on Aug. 11, 2016, now Pat. No. 9,805,821.

(30) Foreign Application Priority Data

Sep. 29, 2015  (JP) .................................. 2015-191553

(51) Int. Cl.
*G11C 7/00* (2006.01)
*G11C 11/418* (2006.01)
(Continued)

(52) U.S. Cl.
CPC .............. *G11C 7/00* (2013.01); *G11C 11/418* (2013.01); *G11C 11/419* (2013.01); *G11C 29/02* (2013.01);
(Continued)

(58) Field of Classification Search
CPC .............. G11C 29/02; G11C 29/12015; G11C 29/12005; G11C 29/18; G11C 29/04;
(Continued)

(56) References Cited

U.S. PATENT DOCUMENTS 5,930,185 A    7/1999  Wendell
7,606,092 B2  10/2009  Eby
(Continued)

FOREIGN PATENT DOCUMENTS

JP    2000-322900 A    11/2000
JP    2009/295246 A    12/2009
JP    2014-099225 A     5/2014

OTHER PUBLICATIONS

U.S. Appl. No. 15/234,910,Non_Patent_Literature,Feb. 8, 2017.pdf (Year: 2009).*
(Continued)

*Primary Examiner* — Ajay Ojha
(74) *Attorney, Agent, or Firm* — McGinn IP Law Group, PLLC.

(57) ABSTRACT

A test method for a semiconductor memory device having a plurality of memory cells arranged in a matrix form, the test method including writing first data into a plurality of memory cells, while a plurality of word lines disposed in the columns of the memory cells are deselected, driving the low-potential side bit line of a bit line pair in the selected column, which is among a plurality of bit line pairs disposed in the columns of the memory cells, to a negative voltage level in accordance with second data complementary to the first data, and reading the data written into the memory cells.

13 Claims, 16 Drawing Sheets

(51) Int. Cl.
*G11C 11/419* (2006.01)
*G11C 29/02* (2006.01)
*G11C 29/12* (2006.01)
*G11C 29/04* (2006.01)
*G11C 29/18* (2006.01)
*G11C 29/50* (2006.01)
*G11C 29/28* (2006.01)

(52) U.S. Cl.
CPC .............. *G11C 29/04* (2013.01); *G11C 29/12* (2013.01); *G11C 29/1201* (2013.01); *G11C 29/12005* (2013.01); *G11C 29/12015* (2013.01); *G11C 29/18* (2013.01); *G11C 29/50016* (2013.01); *G11C 29/28* (2013.01); *G11C 29/50* (2013.01); *G11C 2029/1202* (2013.01); *G11C 2029/1204* (2013.01)

(58) Field of Classification Search
CPC .......... G11C 29/50016; G11C 29/1201; G11C 11/418; G11C 11/419; G11C 29/12; G11C 2029/1204; G11C 2029/1202; G11C 29/28; G11C 29/50
See application file for complete search history.

(56) References Cited

U.S. PATENT DOCUMENTS

| | | | |
|---|---|---|---|
| 7,904,767 B2 | 3/2011 | Park | |
| 2008/0253209 A1* | 10/2008 | Nagata | .................. G11C 29/12 |
| | | | 365/201 |
| 2015/0131364 A1 | 5/2015 | Hsieh et al. | |

OTHER PUBLICATIONS

United States Notice of Allowance dated Jun. 26, 2017 in parent U.S. Appl. No. 15/234,910.
United States Non-Final Office Action dated Feb. 8, 2017 in parent U.S. Appl. No. 15/234,910.
J. Chang, et al, "A 20nm 112Mb SRAM Design in High K/MetalGate Technology with Assist Circuitry for Low Leakage and Low Vmin Applications," ISSCC'13, 2013, pp. 316-317.
Japanese Office Action dated Oct. 9, 2018, in corresponding Japanese Patent Application No. 2015-191533, with an English translation thereof.

* cited by examiner

SEMICONDUCTOR MEMORY DEVICE AND TEST METHOD THEREFOR

CROSS-REFERENCE TO RELATED APPLICATIONS

The present application is a Divisional Application of U.S. patent application Ser. No. 15/234,910, filed on Aug. 11, 2016, which is based on Japanese Patent Application No. 2015-191553 filed on Sep. 29, 2015 including the specification, drawings, and abstract is incorporated herein by reference in its entirety.

BACKGROUND

The present disclosure relates to a semiconductor memory device, and particularly to the detection of a memory cell failure.

Transistor elements are being miniaturized for high integration. In parallel with miniaturization, voltage scaling is needed from the viewpoint of transistor element reliability and power consumption. However, when the transistor elements are miniaturized, an error in a manufacturing process (mask misalignment and impurity implantation quantity error) exerts a significant influence so that the characteristics of transistor elements greatly vary. Therefore, a write margin decreases, for example, in an SRAM (static random-access memory), thereby causing a problem in which an operating margin is decreased.

As a method of addressing the above problem, a write operation failure may be prevented by applying a negative voltage to a bit line during a write operation in order to increase the current drive capability of an access MOS transistor in a memory cell (refer to Japanese Unexamined Patent Application Publication No. 2009-295246 and J. Chang, et al, "A 20 nm 112 Mb SRAM Design in High K/Metal Gate Technology with Assist Circuitry for Low Leakage and Low Vmin Applications", ISSCC '13).

According to Japanese Unexamined Patent Application Publication No. 2009-295245, a boost circuit is formed of a boost capacitor and an inverter driving the boost capacitor is provided and coupled to bit line pairs through switches. A method described in this patent literature is to transfer a negative voltage by selecting a switch on the bit line side, which is driven by a ground potential.

According to "A 20 nm 112 Mb SRAM Design in High K/Metal Gate Technology with Assist Circuitry for Low Leakage and Low VMin Applications", an inverter is provided as a write drive circuit for each bit line pair. Sources of two write inverters are short-circuited and coupled to a low-voltage side power supply VSS through a power switch. A boost capacitor is coupled to the short-circuited sources of the write inverters. When the power switch is turned off, only the output node of an inverter on the ground voltage output side is placed in a floating state. A method described in this patent literature is to transfer a boosted negative voltage to a bit line through the NMOS and Y switch of a write inverter that outputs a ground voltage.

SUMMARY

However, when a bit line is to be driven to a negative voltage, it is necessary to detect a memory cell having a retention failure in which retained data is destroyed by an unintended current flow when an access MOS transistor coupled to a deselected word line is placed in a state close to conduction.

In the past, there was no means to accurately detect a memory cell having the retention failure.

The present disclosure has been made to address the above problem and provides a semiconductor memory device and a test method therefor that can accurately detect the retention failure of a memory cell.

Other problems and novel features will become apparent from the following description and from the accompanying drawings.

According to an aspect of the present disclosure, there is provided a semiconductor memory device including a memory array, a plurality of bit line pairs, and a plurality of word lines. The memory array includes a plurality of memory cells that are arranged in a matrix form. The bit line pairs are disposed in individual memory cell columns. The word lines are disposed in individual memory cell rows. The semiconductor memory device further includes a write drive circuit and a control circuit. The write drive circuit transfers data to a bit line pair in a selected column in accordance with write data. The control circuit deselects the word lines during a test, and drives a low-potential side bit line of the bit line pair in the selected column to a negative voltage level in accordance with the potentials of bit lines in the selected column.

According to an aspect of the present disclosure, the semiconductor memory device is capable of accurately detecting the retention failure of a memory cell.

BRIEF DESCRIPTION OF THE DRAWINGS

Embodiments of the present disclosure will be described in detail based on the following figures, in which.

DETAILED DESCRIPTION

Figure 1:
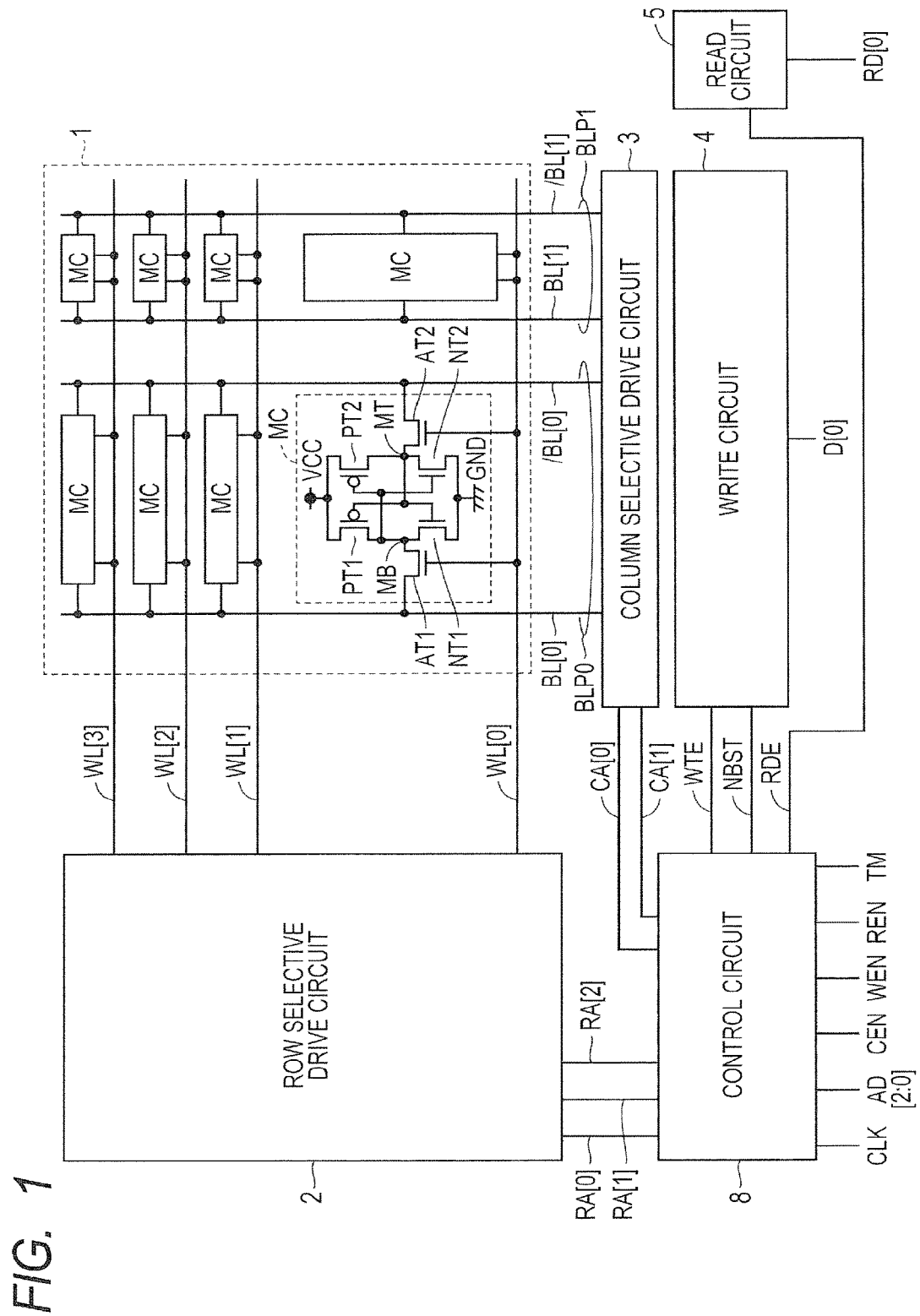
FIG. 1 is an external view illustrating a configuration of a semiconductor memory device according to a first embodiment of the present disclosure.

Embodiments of the present disclosure will now be described with reference to the accompanying drawings. Elements that are depicted in the drawings and identical or equivalent to each other are designated by the same reference numerals and will not be redundantly described.

First Embodiment

FIG. 1 is an external view illustrating a configuration of a semiconductor memory device according to a first embodiment of the present disclosure.

As illustrated in FIG. 1, the semiconductor memory device includes a memory array 1, a row selective drive circuit 2, a column selective drive circuit 3, a write circuit 4, a read circuit 5, and a control circuit 8.

The memory array 1 includes a plurality of memory cells MC that are disposed in a matrix form.

The memory array 1 includes a plurality of word lines WL and a plurality of bit line pairs BLP. The word lines WL are respectively disposed in memory cell rows. The bit line pairs BLP are respectively disposed in memory cell columns.

The bit line pairs BLP each include a bit line BL and a bit line /BL.

The present example depicts the word lines WL[0]-WL[3] and the bit line pairs BLP0, BLP1. The word lines WL[0]-WL[3] are respectively disposed in four memory cell rows. The bit line pairs BLP0, BLP1 are respectively disposed in two memory cell columns. Some additional rows and columns of memory cells may be disposed.

The bit line pair BLP0 includes a bit line BL[0] and a bit line /BL[0]. The bit line pair BLP1 includes a bit line BL[1] and a bit line /BL[1].

Each memory cell MC is a rewritable SRAM (static random-access memory) cell. Each memory cell MC is a static memory cell that is faulted of a drive transistor, a transfer transistor, and a load element as described later. More specifically, each of the depicted memory cells MC is a 6-transistor SEAM cell including two access transistors AT1, AT2 (transfer transistors), two drive transistors NT1, NT2, and two load transistors PT1, PT2 (load elements).

The access transistors AT1, AT2 are electrically coupled to the associated word line WL. The access transistors AT1, AT2 become conductive in accordance with the word line WL that is activated when a data read or a data write is performed on a memory cell MC.

The load transistor PT1 and the drive transistor NT1 are coupled between a power supply voltage VCC and a ground voltage GND.

The load transistor PT2 and the drive transistor NT2 are coupled between the power supply voltage VCC and the ground voltage GND.

The gate of the load transistor PT1 and the gate of the drive transistor NT1 are both coupled to a storage node MT, which is a connection node for the load transistor PT2 and the drive transistor NT2. The access transistor AT2 is disposed between the storage node MT and the bit line /BL[0]. The gate of the access transistor AT2 is coupled to the word line WL[0].

The gate of the load transistor PT2 and the gate of the drive transistor NT2 are both coupled to a storage node MB, which is a connection node for the load transistor PT1 and the drive transistor NT1. The access transistor AT1 is disposed between the storage node MB and the bit line BL[0]. The gate of the access transistor AT1 is coupled to the word line WL[0].

The configurations of the other memory cells MC are basically the same as described above.

The row selective drive circuit 2 drives (selects) a word line WL in accordance with row address signals RA[0]-RA[2] inputted from the control circuit 8.

The column selective drive circuit 3 selects a bit line pair BLP in accordance with column address signals CA[0], CA[1] inputted from the control circuit 8.

The write circuit 4 drives a bit line pair BLP in a column that is selected by the column selective drive circuit 3 in accordance with a control signal WTE, a control signal NBST, and write data D[0].

For example, the bit line BL[0] is set to an "H" level (power supply voltage VCC) in accordance with the write data D[0], and the bit line /BL[0] is set to an "L" level (ground voltage GND). Further, the bit line /BL[0] is set to a negative potential in accordance with the control signal NBST.

The read circuit 5 reads data in a memory cell MC coupled to a bit line pair BLP in a column that is selected by the column selective drive circuit 3 in accordance with a control signal RDE. During a data read, for example, the bit lines BL, /BL of a bit line pair BLP are both set to the "H" level (power supply voltage VCC). When a word line WL is selected, the access transistors AT1, AT2 become conductive so that the potentials of the bit lines BL, /BL change in accordance with the data retained by the memory cell MC. The read circuit 5 detects a potential difference between the bit lines BL, /BL of the bit line pair BLP, amplifies the detected potential difference, and outputs the amplified result as read data RD[0].

The control circuit 8 operates in accordance with a clock signal CLK, an address signal AD[2:0], and control signals CEN, WEN, REN, TM.

More specifically, the control circuit 8 is activated in accordance with the control signal CEN and operates in synchronism with the clock signal CLK. As described later, the control circuit 8 generates a row address signal RA and a column address signal CA in accordance with a 3-bit address signal AD[2:0].

The control circuit 8 performs a data write in accordance with the control signal WEN and activates the control signal WTE.

The control circuit 8 performs a data read in accordance with the control signal REN and activates the control signal RDE.

The control circuit 8 sets a test mode in accordance with the control signal TM. In the present example, the test mode performs a data write to a memory cell having a retention failure.

Figure 2:
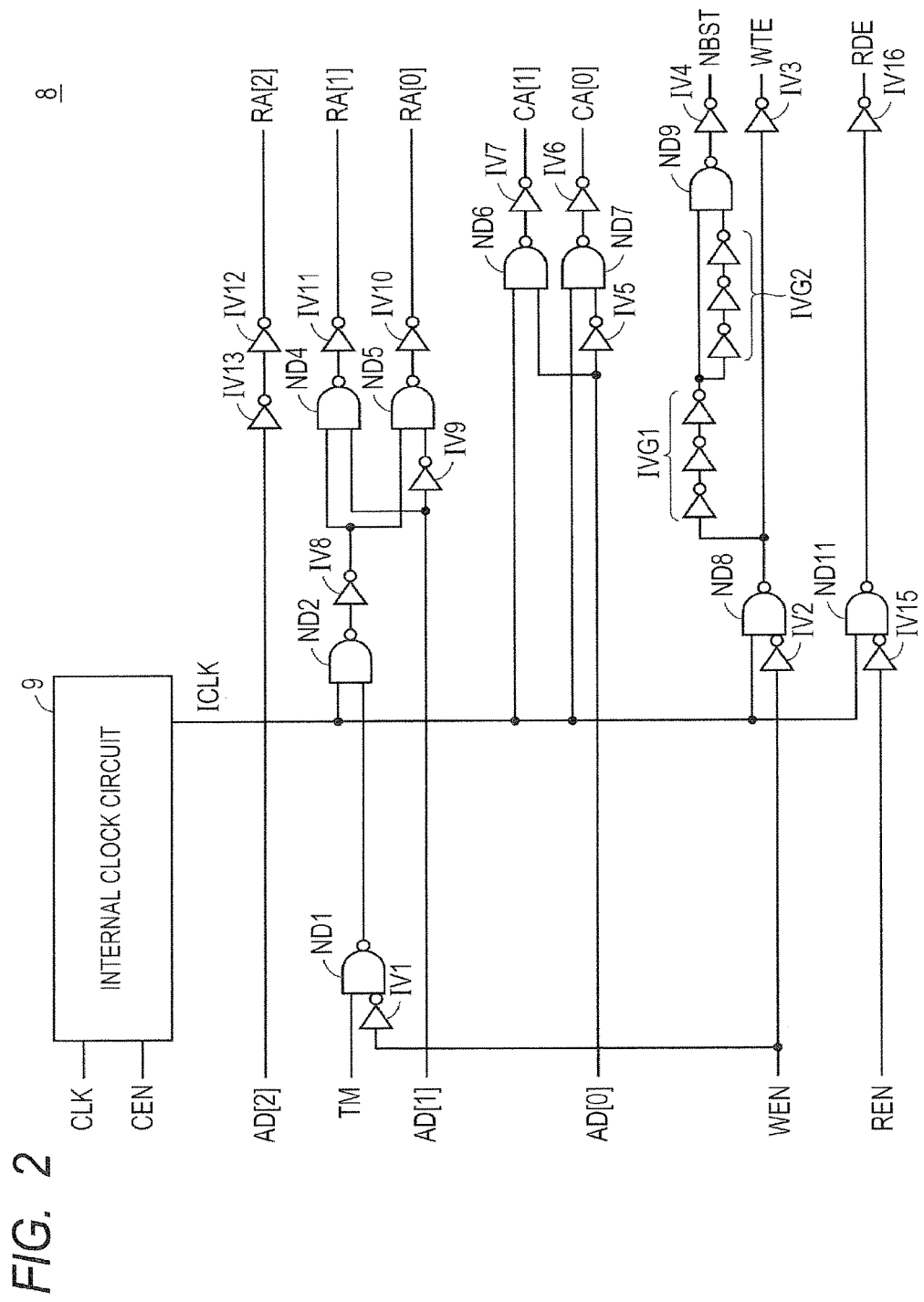
FIG. 2 is a diagram illustrating an internal circuit configuration of a control circuit according to the first embodiment.

FIG. 2 is a diagram illustrating an internal circuit configuration of the control circuit 8 according to the first embodiment.

Referring to FIG. 2, the control circuit 8 includes an internal clock circuit 9, NAND circuits ND1-ND11, inverters IV1-IV16, and inverter groups IVG1, IVG2.

The internal clock circuit 9 operates in accordance with the clock signal CLK and the control signal CEN.

More specifically, the internal clock circuit 9 is activated in accordance with an input of the control signal CEN ("L" level) and generates an internal clock signal ICLK based on the clock signal CLK.

Each internal circuit operates in accordance with the internal clock signal ICLK.

In the present example, an address signal AD[0] is used for column selection, and address signals AD[1], AD[2] are used for row selection.

The NAND circuit ND6 NANDs the internal clock signal ICLK and the address signal AD[0], and outputs the NANDed result. The inverter IV7 inverts the signal of the NAND circuit ND6 and outputs the inverted signal as the column address signal CA[1].

The NAND circuit ND7 NANDs the internal clock signal ICLK and an inverse of the address signal AD[0], which is inputted through the inverter IV5, and outputs the NANDed result. The inverter IV6 inverts the signal of the NAND circuit ND7 and outputs the inverted signal as the column address signal CA[0].

If, for example, the address signal AD[0] is at the "H" level, the control circuit 8 operates in synchronism with the internal clock signal ICLK to set the column address signal CA[1] to the "H" level and the column address signal CA[0] to the "L" level.

When the address signal AD[0] is at the "L" level, the control circuit 8 operates in synchronism with the internal clock signal ICLK to set the column address signal CA[0] to the "H" level and the column address signal CA[1] to the "L" level.

Upon receipt of the control signal. TM and an inverse of the control signal WEN, which is inputted through the inverter IV1, the NAND circuit ND1 NANDs the received signals and outputs the NANDed result to the NAND circuit ND2. If the control signal TM is at the "L" level, the output signal of the NAND circuit ND1 is set to the "L" level.

Upon receipt of the internal clock signal ICLK and the output signal of the NAND circuit ND1, the NAND circuit ND2 NANDs the received signals and outputs the NANDed result. The inverter IV8 inverts the signal of the NAND circuit ND2 and outputs the inverted signal to the NAND circuits ND3, ND4, ND5.

The address signal AD[2] is outputted as the row address signal RA[2] through the inverters IV12, IV13.

Upon receipt of the address signal AD[1] and an inverse of the signal of the NAND circuit ND2, which is inputted through the inverter IV8, the NAND circuit ND4 NANDs the received signals and outputs the NANDed result. The inverter IV11 inverts the signal of the NAND circuit ND4 and outputs the inverted signal as the row address signal RA[1].

Upon receipt of an inverse of the address signal AD[1], which is inputted through the inverter IV9, and an inverse of the signal of the NAND circuit ND2, which is inputted through the inverter IV8, the NAND circuit ND5 NANDs the received signals and outputs the NANDed result. The inverter IV10 inverts the signal of the NAND circuit ND5 and outputs the inverted signal as the row address signal RA[0].

If, for example, the address signals AD[1], AD[2] are both at the "L" level, the control circuit 8 operates in synchronism with the internal clock signal ICLK to set the row address signal. RA[0] to the "H" level and the row address signals RA[1], PA [2] to the "L" level.

It is assumed that the control signal TM is set to the "L" level. Thus, it is assumed that the output signal of the NAND circuit ND1 is set to the "H" level.

When the address signal AD[1] is at the "H" level and the address signal AD[2] is at the "L" level, the control circuit 8 operates in synchronism with the internal clock signal ICLK to set the row address signal RA[1] to the "H" level and the row address signals RA[0], RA[2] to the "L" level.

When the address signal AD[1] is at the "L" level and the address signal AD[2] is at the "H" level, the control circuit 8 operates in synchronism with the internal clock signal ICLK to set the row address signals RA[2], RA[0] to the "H" level and the row address signal RA[1] to the "L" level.

When the address signal AD[1] is at the "H" level and the address signal AD[2] is at the "H" level, the control circuit 8 operates in synchronism with the internal clock signal ICLK to set the row address signals RA[2], RA[1] to the "H" level and the row address signal RA[0] to the "L" level.

Upon receipt of the internal clock signal ICLK and an inverse of the control signal WEN, which is inputted through the inverter IV2, the NAND circuit ND8 NANDs the received signals and outputs the NANDed result.

The inverter IV3 inverts the signal of the NAND circuit ND8 and outputs the inverted signal as the control signal WTE. If, for example, the control WEN is set to the "L" level, the control circuit 8 operates in synchronism with the internal clock signal ICLK to set the control signal WTE to the "H" level.

The inverter group IVG1, which includes an odd number of series-coupled inverters, inverts the signal of the NAND circuit ND8 and outputs the inverted signal to the NAND circuit ND9.

The inverter group IVG2, which includes an odd number of series-coupled inverters, receives the output signal of the inverter group IVG1, inverts the received signal, and outputs the inverted signal to the NAND circuit ND9.

Upon receipt of an output signal from the inverter group IVG1 and an output signal from the inverter group IVG2, the NAND circuit ND9 NANDs the received signals and outputs the NANDed result. The inverter IV4 inverts the signal of the NAND circuit ND9 and outputs the inverted signal as the control signal NBST.

It is assumed, as an example, the output signal of the NAND circuit ND8 is set to the "H" level. In this instance, the output signal of the inverter group IVG1 is at the "L" level. Meanwhile, the output signal of the inverter group IVG2 is at the "H" level. The output signal of the NAND circuit ND9 is set to the "H" level. Thus, the control signal NBST is set to the "L" level.

If the output signal of the NAND circuit ND8 changes to the "L" level, the output signal of the inverter group IVG1 is set to the "H" level. Meanwhile, with a delay of a predetermined period, the output signal of the inverter group IVG2 is changed from the "H" level to the "L" level. Therefore, when the output signal of the inverter group IVG1 is set to the "H" level, the output signal of the NAND circuit ND9 is set to the "L" level. Consequently, the control signal NBST is set to the "H" level as a one-shot pulse signal.

Upon receipt of the internal clock signal ICLK and an inverse of the control signal REN, which is inputted through the inverter IV15, the NAND circuit ND11 NANDs the received signals and outputs the NANDed result.

The inverter IV16 inverts the signal of the NAND circuit ND11 and outputs the inverted signal as the control signal RDE. If, for example, the control signal REN is set to the "L" level, the control circuit 8 operates in synchronism with the internal clock signal ICLK to set the control signal RDE to the "H" level.

If the control signal TM is set to the "H" level in a situation where the control signal WEN is at the "L" level, the output of the NAND circuit ND1 is set to the "L" level. As a result, the output of the NAND circuit ND2 is set to the "H" level. Therefore, the inverter IV8 outputs an inverted signal of the "H" level, that is, the "L" level. The row address signals RA[1], RA[1] are then set to the "L" level without regard to the address signal AD[1]. In this instance, the word lines WL are not driven.

Figure 3:
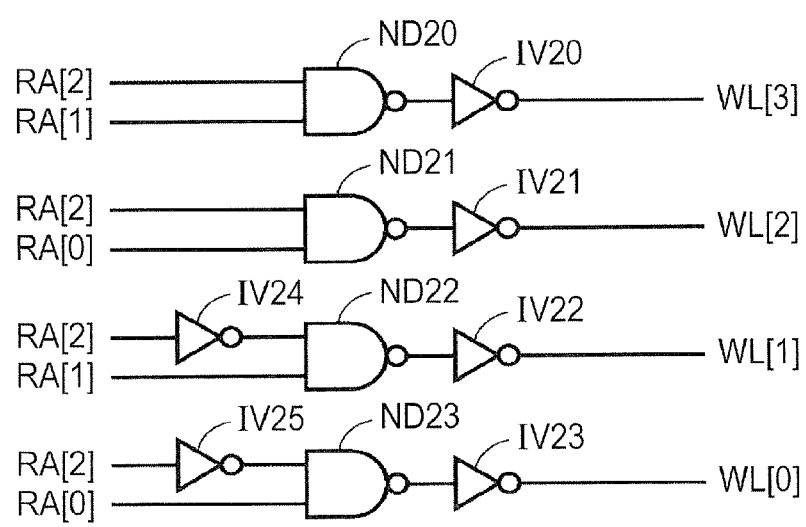
FIG. 3 is a diagram illustrating a circuit configuration of a row selective drive circuit according to the first embodiment.

FIG. 3 is a diagram illustrating a circuit configuration of the row selective drive circuit 2 according to the first embodiment.

Referring to FIG. 3, the row selective drive circuit 2 includes NAND circuits ND20-ND23 and inverters IV20-IV25.

Upon receipt of the row address signals RA[1], RA[2], the NAND circuit ND20 NANDs the received signals and outputs the NANDed result to the inverter IV20. The inverter IV20 inverts the signal of the NAND circuit ND20 and drives the word line WL[3] in accordance with the inverted signal.

Upon receipt of the row address signals RA[0], RA[2], the NAND circuit ND21 NANDs the received signals and outputs the NANDed result to the inverter IV21. The inverter IV21 inverts the signal of the NAND circuit ND21 and drives the word line WL[2] in accordance with the inverted signal.

Upon receipt of the row address signal RA[1] and an inverse of the row address signal RA[2], which is inputted through the inverter IV24, the NAND circuit ND22 NANDs the received signals and outputs the NANDed result to the inverter IV22. The inverter IV22 inverts the signal of the NAND circuit ND22 and drives the word line WL[1] in accordance with the inverted signal.

Upon receipt of the row address signal RA[0] and an inverse of the row address signal RA[2], which is inputted through the inverter IV25, the NAND circuit ND23 NANDs the received signals and outputs the NANDed result to the inverter IV23. The inverter IV23 inverts the signal of the NAND circuit ND23 and drives the word line WL[0] in accordance with the inverted signal.

As described earlier, when the address signals AD[1], AD[2] are both at the "L" level, the row address signal RA[0] is set to the "H" level and the row address signals RA[1], RA[2] are set to the "L" level. In this instance, the row selective drive circuit 2 drives (activates) the word line WL[0].

When the address signal AD[1] is at the "H" level and the address signal AD[2] is at the "L" level, the row address signal RA[1] is set to the "H" level and the row address signals RA[0], RA[2] are set to the "L" level. In this instance, the row selective drive circuit 2 drives (activates) the word line WL[1].

When the address signal AD[1] is at the "L" level and the address signal AD[2] is at the "H" level, the row address signals RA[2], RA[0] are set to the "H" level and the row address signal RA[1] is set to the "L" level. In this instance, the row selective drive circuit 2 drives (activates) the word line WL[2].

When the address signal AD[1] is at the "H" level and the address signal AD[2] is at the "H" level, the row address signals RA[2], RA[1] are set to the "H" level and the row address signal RA[0] is set to the "L" level. In this instance, the row selective drive circuit 2 drives (activates) the word line WL[3].

If the control signal TM is at the "H" level, the row address signals RA[0], RA[1] are set to the "L" level. Thus, none of the word lines WL[0]-WL[3] are driven.

Figure 4:
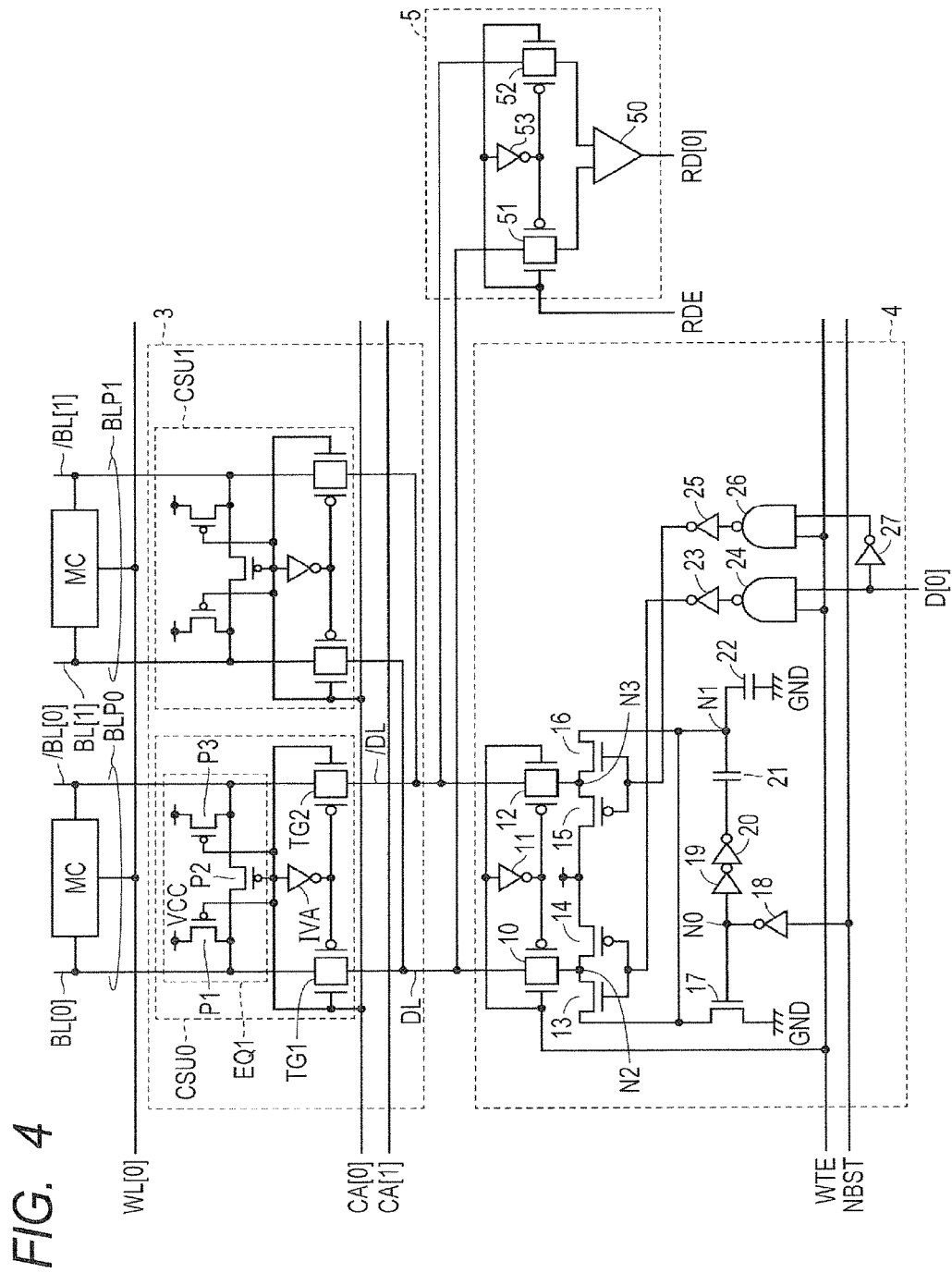
FIG. 4 is a diagram illustrating circuit configurations of a column selective drive circuit, a write circuit, and a read circuit in accordance with the first embodiment.

FIG. 4 is a diagram illustrating circuit configurations of the column selective drive circuit 3, the write circuit 4, and the read circuit 5 in accordance with the first embodiment.

Referring to FIG. 4, the column selective drive circuit 3 includes a plurality of column selection gate units CSU.

In the present example, the column selection gate units CSU0, CSU1 are respectively provided for the bit line pairs BLP0, BLP1.

The column selection gate unit CSU0 includes an equalizer circuit EQ1, transfer gates TG1, TG2, and an inverter IVA.

The transfer gate TG1 is disposed between a data line DL and the bit line BL[0]. The transfer gate TG2 is disposed between a data line /DL and the bit line /BL[0]. The transfer gates TG1, TG2 become conductive in accordance with the column address signal CA[0] and an inverted signal inputted through the inverter IVA.

For example, the transfer gates TG1, TG2 become conductive when the column address signal CA[0] is at the "H" level. The data lines DL, /DL are then electrically coupled to the bit lines BL[0], /BL[0].

The equalizer circuit EQ1 includes P-channel MOS transistors P1-P3.

The P-channel MOS transistor P1 is disposed between the power supply voltage VCC and the bit line BL[0]. The gate of the P-channel MOS transistor P1 receives an input of the column address signal CA[0].

The P-channel MOS transistor P2 is disposed between the rower supply voltage VOC and the bit line /BL[0]. The gate of the P-channel MOS transistor P2 receives an input of the column address signal CA[0].

The P-channel MOB transistor P3 is disposed between the bit line BL[0] and the bit line /BL[0]. The gate of the P-channel MOS transistor P3 receives an input of the column address signal CA[0].

For example, the P-channel MOS transistors P1-P3 become conductive when the column address signal CA[0] is at the "L" level. The bit lines BL[0], /BL[0] are then equalized to the "H" level. Meanwhile, the P-channel MOS transistors P1-P3 become nonconductive when the column address signal CA[0] is at the "H" level. The equalization of the bit lines BL[0], /BL[0] then terminates.

Basically, the same holds true for the column selection gate unit CSU1.

The write circuit 4 includes transfer gates 10, 12, inverters 11, 18, 19, 20, 23, 25, 27, capacitors 21, 22, N-channel MOS transistors 13, 16, 17, P-channel MOS transistors 14, 15, and NAND circuits 24, 26.

The transfer gate 10 is disposed between the data line DL and a node N2. The transfer gate 12 is disposed between the data line /DL and a node N3. The transfer gates 10, 12 become conductive in accordance with the control signal WTE and an inverted signal inputted through the inverter 11.

The N-channel MOS transistor 17 is disposed between the ground voltage CND and a node N1. The gate of the N-channel MOS transistor 17 is coupled to a node N0.

Upon receipt of an input of the control signal NBST, the inverter 18 inverts the received input signal and outputs the inverted signal to the node N0. The inverters 19, 20 and the capacitor 21 are disposed between the node N0 and the node N1. The capacitor 22 is disposed between the node N1 and the ground voltage GND.

When the control signal NBST is at the "L" level, the inverter 18 outputs an "H" level signal. As a result, the N-channel MOS transistor 17 becomes conductive to couple the node N1 to the ground voltage GND.

The P-channel MOS transistor 14 is disposed between the node N2 and the power supply voltage VCC. The N-channel MOS transistor 13 is disposed between the node N2 and the node N1. The gates of the N-channel MOS transistor 13 and P-channel MOS transistor 14 receive the input of an output signal of the inverter 23.

The P-channel MOS transistor 15 is disposed between the node N3 and the power supply voltage VCC. The N-charnel MOS transistor 16 is disposed between the node N3 and the node N1. The gates of the N-channel MOS transistor 15 and P-channel MOS transistor 16 receive the input of an output signal of the inverter 25.

Based on the input of the control signal WTE and data D[0], the NAND circuit 24 NANDs the inputted signal and data, and outputs the NANDed result to the inverter 23. The inverter 23 inverts the output signal of the NAND circuit 24 and outputs the inverted signal.

Based on the input of the control signal WTE and the input of an inverted signal of the data D[0], the NAND circuit 26 NANDs the inputted signals and outputs the NANDed result to the inverter 25. The inverter 25 inverts the output signal of the NAND circuit 26 and outputs the inverted signal.

During a data write, the control signal WTE is set to the "H" level. Meanwhile, the control signal RDE is set to the "L" level.

When the control signal WTE is at the "H" level and the data D[0] is set to the "H" level, the output signal of the inverter 23 is at the "H" level and the output signal of the inverter 25 is at the "L" level. As a result, the N-channel MOS transistor 13 and the P-channel MOS transistor 15 become conductive. In accordance with the control signal WTE ("H" level), the transfer gates 10, 12 are conductive. Further, as the control signal NBST is set to the "L" level by default, the node N1 is coupled to the ground voltage GND. Therefore, the data line DL is coupled to the ground voltage GND through the node N1 and set to the "L" level. Meanwhile, the data line /DL is coupled to the power supply voltage VCC and set to the "H" level.

When the control signal WTE is at the "H" level and the data D[0] is set to the "L" level, the output signal of the inverter 25 is at the "H" level and the output signal of the inverter 23 is at the "L" level. As a result, the N-channel MOS transistor 16 becomes conductive. Additionally, the P-channel MOS transistor 14 becomes conductive. In accordance with the control signal WTE ("H" level), the transfer gates 10, 12 are conductive. Further, as the control signal NBST is set to the "L" level by default, the node N1 is coupled to the ground voltage GND. Therefore, the data line DL is coupled to the power supply voltage VCC and set to the "H" level. The data line /DL is coupled to the ground voltage GND through the node N1 and set to the "L" level.

When, in this instance, the control signal NBST is set to the "H" level, the inverter 18 makes the N-channel MOS transistor 17 nonconductive, thereby placing the node N1 in a floating state.

Next, the outputs of the inverters 19, 20 are set to the "L" level. The node N1 is boosted to a negative potential through the capacitor 21. Boosting the node N1 to the negative potential raises the potential of a data line coupled to the node N1.

Consequently, the gate-source voltage Vgs of the access transistor AT in the memory cell increases to increase the current drive capability of the access transistor AT, thereby further raising the potential of a storage node. The other storage node is raised to the "H" level to accelerate the inversion of the storage node. This makes it possible to perform a high-speed, stable data write.

The present example explains about a method of boosting to a negative potential by using a capacitive element. Alternatively, however, a negative potential generation circuit (not shown) may be provided without using a capacitive element in order to supply a negative potential from the negative potential generation circuit.

The read circuit 5 includes a sense amplifier 50, transfer gates 51, 52, and an inverter 53.

The transfer gate 51 is disposed between the data line DL and one input node of the sense amplifiers 50. The transfer gate 52 is disposed between the data line /DL and the other input node of the sense amplifier 50. The transfer gates 51, 52 become conductive in accordance with the control signal RDE and an inverted signal inputted through the inverter 53. The sense amplifier 50 amplifies the potential difference between the input nodes and outputs the amplified potential difference as the read data RD[0].

During a data read, the control signal WTE is set to the "L" level Meanwhile, the control signal RDE is set to the "H" level.

When the control signal RDE is at the "H" level and the potential level of a bit line BL coupled through the data line DL is higher than the potential level of a bit line /BL coupled through the data line/DL, the sense amplifier 50 outputs the "H" level as the read data RD[0]. If, by contrast, the potential level of a bit line /BL coupled through the data line /DL is higher than the potential level of a bit line BL coupled through the data line DL, the sense amplifier 50 outputs the "L" level as the read data RD[0]. This makes it possible to perform a data read that detects read data written in the memory cell MC.

Figure 5:
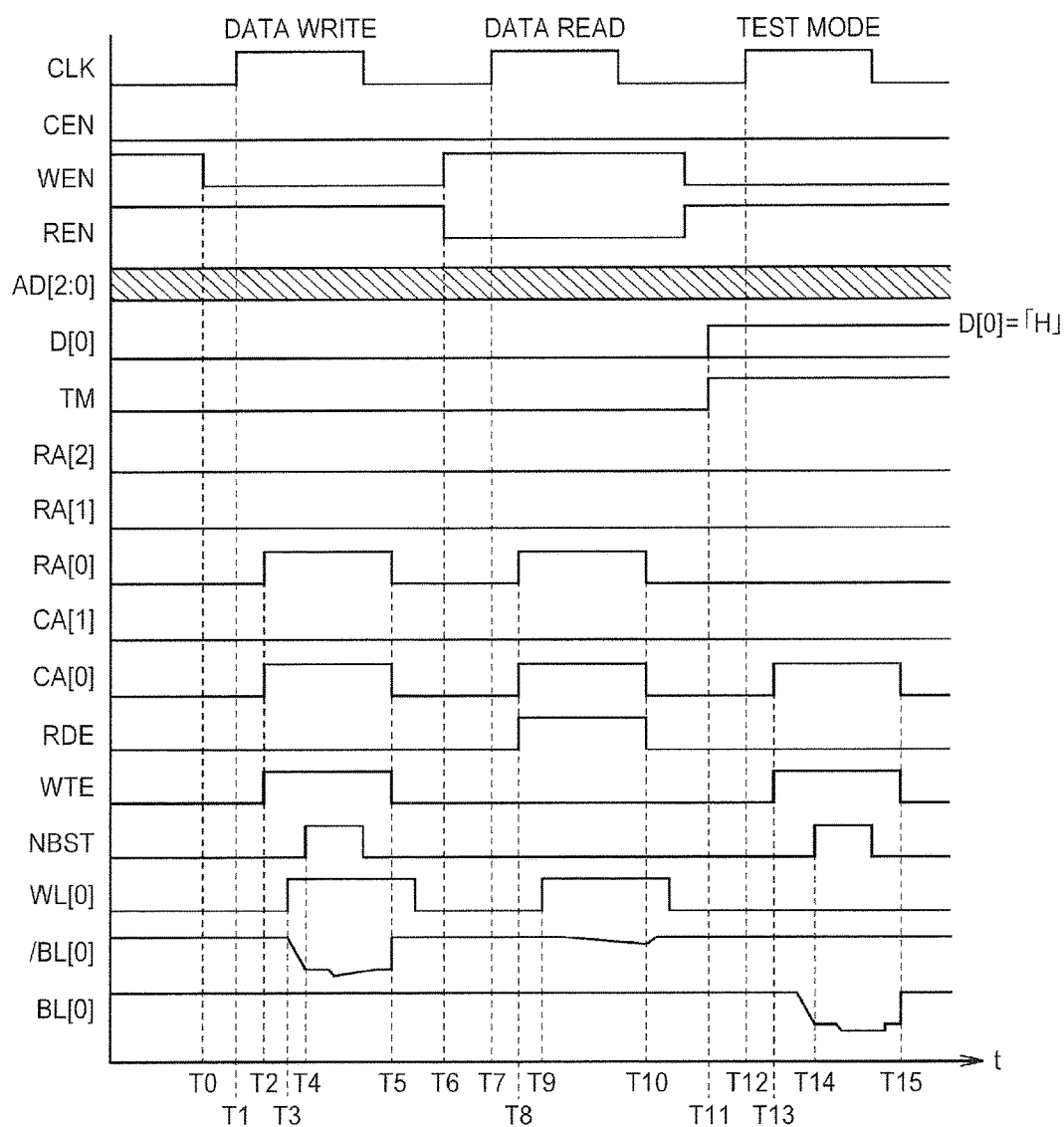
FIG. 5 is a timing diagram illustrating the signal relationship between memory array data write, data read, and test mode in accordance with the first embodiment.

FIG. 5 is a timing diagram illustrating the signal relationship between memory array data write, data read, and test mode in accordance with the first embodiment.

Referring to FIG. 5, the clock signal CLK is inputted at predetermined clock intervals. FIG. 5 depicts a case where the control signal CEN is set to the "L" level.

During a data write, the control signal WEN is set at time T0 to the "L" level. At time T1, the clock signal CLK is set to the "H" level. In the present example, the address signal AD[0] is at the "L" level, and the address signals AD[1], AD[2] are set to the "L" level. A data signal D[0] is set to the "L" level.

Consequently, the row address signal RA[0] is set at time T2 to the "H" level. Further, the column address signal CA[0] is set to the "H" level. Furthermore, as the control signal WEN is changed to the "L" level, the control WTE is set to the "H" level.

As the column address signal CA[0] is set to the "H" level, the column selection gate unit CSU0 is selected. More specifically, the data line DL is coupled to the bit line BL[0], and the data line /DL is coupled to the bit line /BL[0].

As the control signal WTE is set to the "H" level, the transfer gates 10, 12 become conductive. Further, as the data signal D[0] is set to the "L" level, the inverter 23 is set to the "L" level. The inverter 25 is set to the "H" level. As a result, the P-channel MOS transistor 14 becomes conductive, and the N-channel MOS transistor 16 becomes conductive. Thus, the bit line BL[0] is coupled to the power supply voltage VCC through the data line DL and set to the "H" level. Further, the bit line /BL[0] is coupled to the ground voltage GND through the data line /DL and set to the "L" level.

Subsequently, at time T3, the word line WL[0] is activated (set to the "H" level) as the row address signal RA[0] is set to the "H" level and the row address signals RA[1], RA[2] are set to the "L" level.

A data write is then performed on a memory cell MC coupled to the word line WL[0]. More specifically, the storage node MB is set to the "H" level, and the storage node MT is set to the "L" level.

Next, at time T4, the control signal NBST is set to the "H" level. As a result, the node N1 is boosted to a negative potential. This further lowers the potential of the bit line /BL[0], thereby providing assistance to a data write.

At time T5, the row address signal RA[0], the column address signal CA[0], and the control signal WTE are set to the "L" level.

Consequently, the transfer gates TG1, TG2 become nonconductive to terminate a data write.

Subsequently, during a data read, the control signal WEN is set at time T6 to the "H" level. Further, the control signal REN is set to the "L" level.

At time T7, the clock signal CLK is set to the "H" level. Further, in the present example, the address signal AD[0] is set to the "L" level and the address signals AD[1], AD[2] are set to the "L" level.

Consequently, at time T8, the row address signal RA[0] is set to the "H" level. Further, the column address signal CA[0] is set to the "H" level. Furthermore, the control signal RDE is set to the "H" level.

As the column address signal CA[0] is set to the "H" level, the column selection gate unit CSU0 is selected. More specifically, the data line DL is coupled to the bit line BL[0], and the data line /DL is coupled to the bit line /BL[0].

In accordance with the control signal RDE ("H" level), the transfer gates 51, 52 become conductive. This electrically couples the sense amplifier 50 to the data lines DL, /DL.

Then, at time T9, the word line WL[0] is set to the "H" level as the row address signal RA[0] is set to the "H" level.

Consequently, a data read is performed on a memory cell MC coupled to the word line WL[0]. More specifically, the potential level of the data line /DL coupled to the storage node MT lowers. Meanwhile, the potential level of the data line DL coupled to the storage node MB remains unchanged. Based on the potential difference between the data lines DL, /DL, the sense amplifier 50 outputs the data stored in the memory cell MC as the read data RD[0]. In the present example, the read data RD[0] is at the "L" level when outputted.

Next, at time T10, the row address signal RA[0] and the column address signal CA[0] are set to the "L" level. Further, the control signal RDE is set to the "L" level.

Consequently, the transfer gates TG1, TG2, 51, 52 become nonconductive to terminate a data read.

The test mode will now be described.

In the present embodiment, the test mode performs a data write to a memory cell having a retention failure.

At time T11, the control signal TM is set to the "H" level. Further, the control signal WEN is set to the "L" level. The data signal D[0] is set to the "H" level.

At time T12, the clock signal CLK is set to the "H" level. Further, in the present example, the address signal AD[0] is set to the "L" level, and the address signals AD[1], AD[2] are set to the "L" level.

At time T13, the column address signal CA[0] is set to the "H" level. Further, as the control signal WEN changes to the "L" the control signal WTE is set to the "H" level.

As the column address signal CA[0] is set to the "H" level, the column selection gate unit CSU0 is selected. More specifically, the data line DL is coupled to the bit line BL[0], and the data line /DL is coupled to the bit line /BL[0].

As the control signal WTE is set to the "H" level, the transfer gates 10, 12 become conductive. Further, as the data signal D[0] set to the "H" level, the inverter 23 is set to the "H" level. The inverter 25 is set to the "L" level. As a result, the P-channel MOS transistor 15 becomes conductive, and the N-channel MOS transistor 13 becomes conductive. Thus, the bit line BL[0] is coupled to the ground voltage GND through the data line DL and set to the "L" level. Further, the bit line /BL[0] is coupled to the power supply voltage VCC through the data line /DL and set to the "H" level.

Meanwhile, in accordance with the "H" level of the control signal TM, the row address signals RA[0], RA[1] are set to the "L" level. Thus, all the word lines WL are deselected.

At time T14, the control signal NBST is set to the "H" level. As a result, the node N1 is boosted to a negative potential. This further lowers the potential of the bit line BL[0].

Consequently, if any memory cell MC has a retention failure, an access MOS transistor coupled to the associated deselected word line is placed in a state close to conduction. This may cause an unintended current flow to invert stored data.

At time T15, the column address signal CA[0] and the control signal WTE are set to the "L" level. As a result, the transfer gates TG1, TG2 become nonconductive to terminate a data write to a memory cell having a retention failure. A memory cell having a retention failure can be detected by writing data into the memory cell having a retention failure and performing a data read to read the written data.

Figure 6:
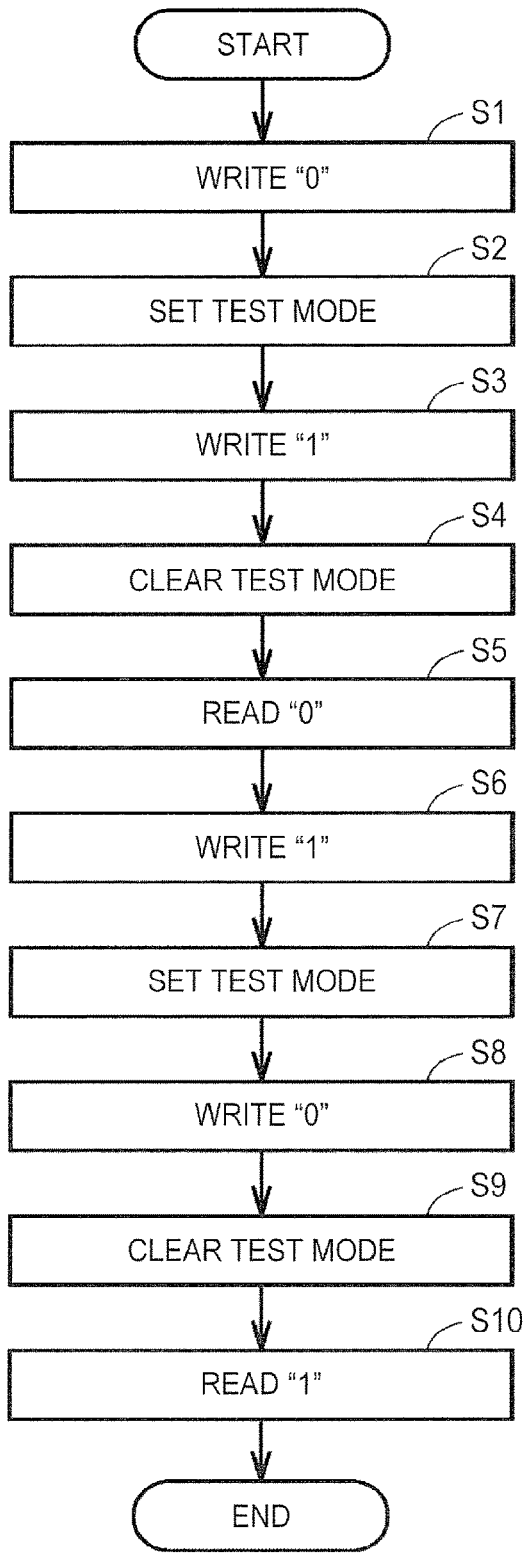
FIG. 6 is a flowchart illustrating a test method for the semiconductor memory device according to the first embodiment.

FIG. 6 is a flowchart illustrating a test method for the semiconductor memory device according to the first embodiment.

Referring to FIG. 6, first of all, data "0" is written into a memory cell MC (step S1).

It is assumed, for example, that data "0" is equivalent to the data signal D[0] at the "L" level, and that data "1" is equivalent to the data signal D[0] at the "H" level.

More specifically, the control signal WEN is set to the "L" level as described with reference to FIG. 5. As a result, the control signal WTE is set to the "H" level.

Further, the address signal AD[0] is set to the "L" level, and the address signals AD[1], AD[2] are set to the "L" level. As the address signal AD[0] is set to the "L" level, the column address signal CA[0] is set to the "H" level and the column address signal CA[1] is set to the "L" level.

As the column address signal CA[0] is set to the "H" level, the column selection gate unit CSU0 is selected. The data line DL is coupled to the bit line BL[0], and the data line /DL is coupled to the bit line /BL[0].

As the control signal WTE is set to the "H" level, the transfer gates 10, 12 become conductive. Further, as the data signal D[0] is set to the "L" level, the inverter 23 is set to the "L" level. The inverter 25 is set to the "H" level. As a result, the P-channel MOS transistor 14 becomes conductive, and the N-channel MOS transistor 16 becomes conductive. Thus, the bit line BL[0] is coupled to the power supply voltage VCC through the data line DL and set to the "H" level. Further, the bit line /BL[0] is coupled to the ground voltage GND through the data line /DL and set to the "L" level.

When the address signals AD[1], AD[2] are at the "L" level, the row address signal RA[0] is set to the "H" level, and the row address signals RA[1], RA[2] are set to the "L" level. As a result, the word line WL[0] is driven.

Consequently, a data write is performed on a memory cell MC coupled to the word line WL[0]. More specifically, the storage node MB is set to the "H" level, and the storage node MT is set to the "L" level. Subsequently, the control signal NBST is set to the "H" level. As a result, the node N1 is boosted to a negative potential. This further lowers the potential of the bit line /BL[0], thereby providing assistance to a data write.

Consequently, data "0" is written into a memory cell MC that is coupled to the word line WL[0] and to the bit line pair BLP0 in the first column. A data write can be similarly performed on the other memory cells MC.

Next, the test mode is set (step S2). More specifically, the control signal TM is set to the "H" level. Further, the control signal WEN is set to the "L" level. As a result the control signal WTE is set to the "H" level.

Next, data "1" is written into a memory cell MC (step S3).

More specifically, the address signal AD[0] is set to the "L" level, and the address signals AD[1], AD[2] are placed in an indeterminate state. As the address signal AD[0] is set to the "L" level, the column address signal CA[0] is set to the "H" level and the column address signal CA[1] is set to the "L" level.

As the column address signal CA[0] is set to the "H" level, the column selection gate unit CSU0 is selected. The data line DL is coupled to the bit line BL[0], and the data line /DL is coupled to the bit line /BL[0].

As the control signal WTE is set to the "H" level, the transfer gates 10, 12 become conductive. Further, as the data signal D[0] is set to the "H" level, the inverter 23 is set to the "H" level. The inverter 25 is set to the "L" level. As a result, the N-channel MOS transistor 13 becomes conductive, and the P-channel MOS transistor 15 becomes conductive. Thus, the bit line BL[0] is coupled to the ground voltage GND through the data line DL and set to the "L" level. Further, the bit line /BL[0] is coupled to the power supply voltage VCC through the data line /DL and set to the "H" level.

As the control signal TM is set to the "H" level, the row address signals RA[0], RA[1] are both set to the "L" level without regard to the address signal AD[1]. Consequently, the word lines WL[0]-WL[3] are set to the "L" level as the row address signals RA[0], RA[1] are set to the "L" level.

Further, the control signal NBST is set to the "H" level. As a result, the node N1 is boosted to a negative potential. This further lowers the potential of the bit line BL[0].

Consequently, if a memory cell MC coupled to the bit line pair BLP0 in the first column has a retention failure, the access MOS transistor AT1 coupled to the associated deselected word line is placed in a state close to conduction. This causes an unintended current flow to invert stored data.

Next, the column address signals are changed. More specifically, the address signal AD[0] is set to the "H" level, and the address signals AD[1], AD[2] are both placed in an indeterminate state.

As the address signal AD[D] is set to the "H" level, the column address signal CA[0] is set to the "L" level and the column address signal CA[1] is set to the "H" level.

As the column address signal CA[1] is set to the "H" level, the column selection gate unit CSU1 is selected. The data line DL is coupled to the bit line BL[1], and the data line /DL is coupled to the bit line /BL[1].

As the control signal WTE is set to the "H" level, the transfer gates 10, 12 become conductive. Further, as the data signal D[0] is set to the "H" level, the inverter 23 is set to the "H" level. The inverter 25 is set to the "L" level. As a result, the N-channel MOS transistor 13 becomes conductive, and the P-channel MOS transistor 15 becomes conductive. Thus, the bit line BL[1] is coupled to the ground voltage GND through the data line DL and set to the "L" level. Further, the bit line /BL[1] is coupled to the power supply voltage VCC through the data line /DL and set to the "H" level.

As the control signal TM is set to the "H" level, the row address signals RA[0], RA[1] are both set to the "L" level without regard to the address signal AD[1]. Consequently, the word lines WL[0]-WL[13] are set to the "L" level as the row address signals RA[0], RA[1] are set to the "L" level.

Further, the control signal NBST is set to the "H" level. As a result, the node N1 is boosted to a negative potential. This further lowers the potential of the bit line BL[1].

Consequently, if a memory cell MC coupled to the hit line pair BLP1 in the second column has a retention failure, the access MOS transistor AT1 coupled to the associated deselected word line is placed in a state close to conduction. This causes an unintended current flow to invert stored data.

Next, the test mode is cleared (step S4). More specifically, the control signal TM is set to the "L" level.

Next, data "0" is read from a memory cell MC (step S5). Data "0" in the memory cell MC, which was written in step S1, is read. A memory cell MC having a retention failure can be detected because data "1" is read from such a memory cell MC.

More specifically, the control signal WEN is set to the "H" level. Further, the control signal REN is set to the "L" level. Furthermore, the address signal AD[0] is set to the "L" level, and the address signals AD[1], AD[2] are set to the "L" level.

When the address signals AD[1], AD[2] are both at the "L" level, the row address signal RA[0] is set to the "H" level. The control signal RDE is set to the "H" level.

As the address signal AD[0] is set to the "L" level, the column address signal CA[0] is set to the "H" level and the column address signal CA[1] is set to the "L" level.

As the column address signal CA[0] is set to the "H" level, the column selection gate unit CSU0 is selected. The data line DL is coupled to the bit line BL[0], and the data line /DL is coupled to the bit line /BL[0].

As the control signal RDE is set to the "H" level, the transfer gates 51, 52 become conductive. This electrically couples the sense amplifier 50 to the data lines DL, /DL.

As the row address signal RA[0] is set to the "H" level, the word line WL[0] is set to the "H" level.

Consequently, a data read is performed on a memory cell MC that is coupled to the word line WL[0].

If the memory cell MC does not have a retention failure, the potential level of the data line /DL coupled to the storage node MT lowers. Meanwhile, the potential level of the data line DL coupled to the storage node MB remains unchanged. Based on the potential difference between the data lines DL, /DL, the sense amplifier 50 outputs the data stored in the memory cell MC as the read data RD[0]. In the present example, the read data RD[0] is at the "L" level when outputted.

If, by contrast, a retention failure occurs in the memory cell MC when the access MOS transistor AT1 becomes conductive, the potential level of the data line DL coupled to the storage node MB lowers. Meanwhile, the potential level of the data line /DL coupled to the storage node MT remains unchanged. Based on the potential difference between the data lines DL, /DL, the sense amplifier 50 outputs the data stored in the memory cell MC as the read data RD[0]. In the present example, the read data RD[0] is at the "H" level when outputted.

The above-described operation is repeatedly performed with respect to all addresses. More specifically, the address signals AD[1], AD[2] are changed to read data stored in memory cells MC coupled to the word lines WL[1], WL[2], WL[3].

After a data read is performed from the first column, a data read is performed from the second column. More specifically, the address signal AD[0] is changed to the "H" level to read, in the same manner as above, data stored in memory cells MC coupled to the word lines WL[0], WL[1], WL[2], WL[3].

If the read data RD[0] is at the "L" level when read from a memory cell MC, the memory cell MC is determined to be normal and without a retention failure. If, by contrast, the read data RD[0] is at the "H" level when read from a memory cell MC, the memory cell MC is determined to have a retention failure.

Next, data "1" is written into a memory cell MC (step S6).
Subsequently, the test mode is set (step S7).
Next, data "0" is written into the memory cell MC (step S8).
Subsequently, the test mode is cleared (step S9).
Next, data "1" is read from the memory cell (step S10).
Processing then terminates (ends).
Steps S6 to S10 are similar to steps S1 to S5 and will not be redundantly described in detail. When testing is performed in steps S6 to S10, it is possible to detect a memory cell MC in which a retention failure occurs when the access MOS transistor AT2 becomes conductive.

When data is written in the test mode by using the test method according to the present embodiment, the bit lines can be maintained at a negative potential level for memory cells MC having a retention failure, which are associated with individual columns while all word lines are deselected.

Consequently, the test method for the semiconductor memory device according to the first embodiment makes it possible to surely detect a retention failure.

First Modification

Figure 7:
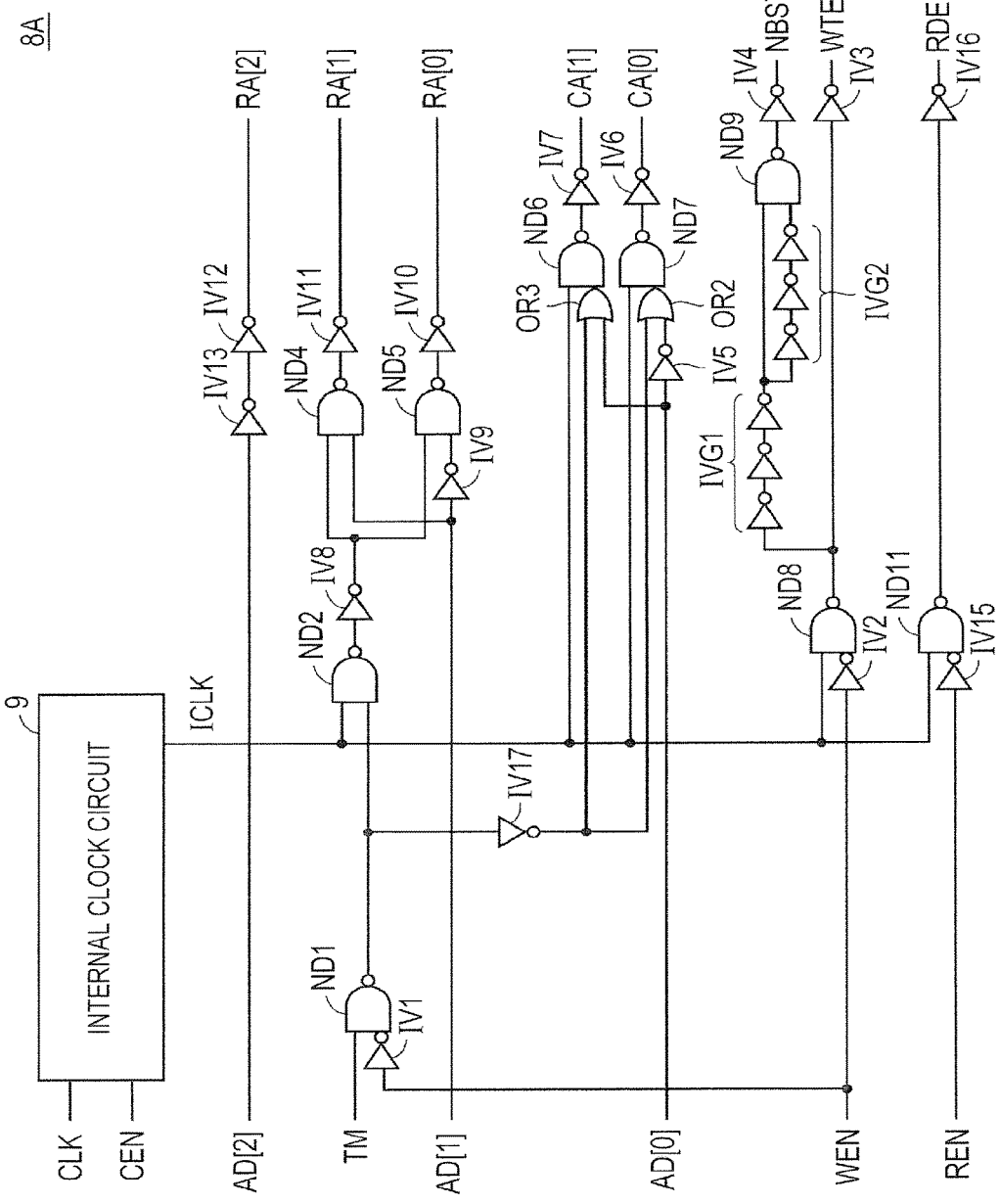
FIG. 7 is a diagram illustrating an internal circuit configuration of the control circuit according to a first modification of the first embodiment.

FIG. 7 is a diagram illustrating an internal circuit configuration of a control circuit 8A according to a first modification of the first embodiment.

Referring to FIG. 7, the control circuit 8A is different from the control circuit 8 in that the former additionally includes an inverter IV17 and OR circuits OR2, OR3. The other elements are the same as those described with reference to FIG. 2 and will not be redundantly described in detail.

The inverter IV17 inverts the signal of the NAND circuit ND1 and outputs the inverted signal to the OR circuits OR2, OR3.

The OR circuit OR2 ORs the output of the inverter IV5 and the output of the inverter IV17, and outputs the ORed result to the NAND circuit ND7. The NAND circuit ND7 NANDs the output of the OR circuit OR2 and the internal clock signal ICLK, and outputs the NANDed result to the inverter IV6.

The OR circuit OR3 ORs the address signal AD[0] and the output of the inverter IV17, and outputs the ORed result to the NAND circuit ND6. The NAND circuit ND6 NANDs the output of the OR circuit OR3 and the internal clock signal ICLK, and outputs the NANDed result to the inverter IV7.

When the control signal TM is set to the "H" level and the control signal WEN is set to the "L" level, the NAND circuit ND1 is set to the "L" level. When the NAND circuit ND1 is set to the "L" level, the output signal generated through the inverter IV17 is set to the "H" level.

Consequently, the NAND circuits ND6, ND7 are both set to the "L" level in accordance with the internal clock signal ICLK. As a result, the column address signals CA[0], CA[1], which are inverted signals derived from the NAND circuits ND6, ND7, are set to the "H" level. That is, the column address signals CA[0], CA[1] are set to the "H" level by setting the control signal TM to the "H" level. This makes it possible to simultaneously select two columns.

Figure 8:
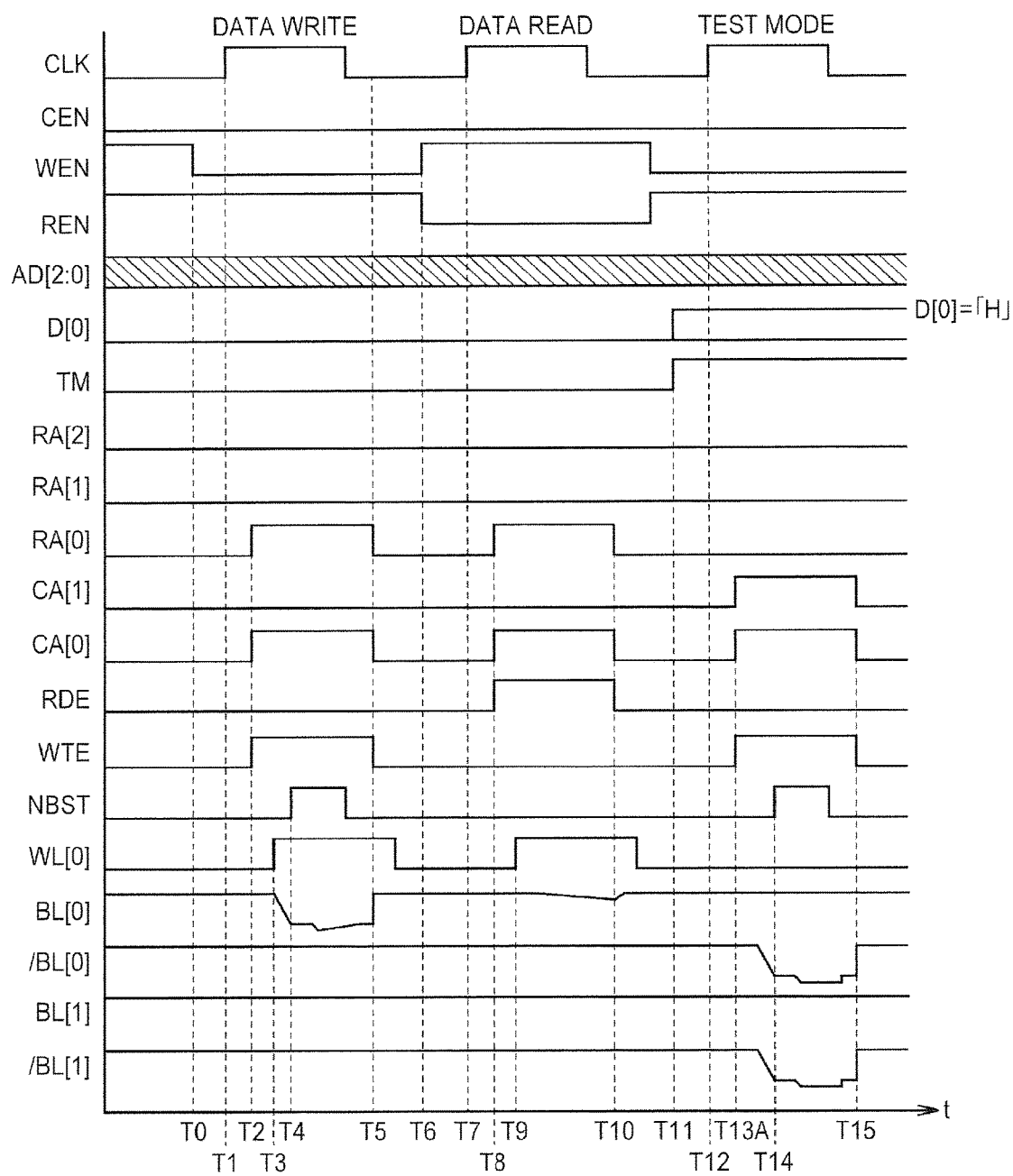
FIG. 8 is a timing diagram illustrating the signal relationship between memory array data write, data read, and test mode in accordance with the first modification of the first embodiment.

FIG. 8 is a timing diagram illustrating the signal relationship between memory array data write, data read, and test mode in accordance with the first modification of the first embodiment.

Referring to FIG. 8, the data write and the data read are the same as described with reference to FIG. 5.

Test mode operations are different from those described with reference to FIG. 5.

In short, an operation performed at time T13 is different. More specifically, the column address signals CA[0], CA[1] are both set to the "H" level at time T13.

Further, as the control signal WEN changes to the "L" level, the control signal WTE is set to the "H" level.

As the column address signals CA[0], CA[1] are set to the "H" level, the column selection gate units CSU0, CSU1 are selected. More specifically, the data line DL is coupled to the bit lines BL[0], BL[1], and the data line /DL is coupled to the bit lines /BL[0], /BL[1].

As the control signal WTE is set to the "H" level, the transfer gates 10, 12 become conductive. Further, as the data signal D[0] is set to the "L" level, the inverter 23 is set to the "L" level. The inverter 25 is set to the "H" level. As a result, the P-channel MOS transistor 14 becomes conductive, and the N-channel MOS transistor 16 becomes conductive. Thus, the bit lines BL[0], BL[1] are coupled to the power supply voltage VCC through the data line DL and set to the "H" level. Further, the bit lines /BL[0], /BL[1] are coupled to the ground voltage GND through the data line /DL and set to the "L" level.

Meanwhile, in accordance with the "H" level of the control signal TM, the row address signals RA[0]-RA[2] are all set to the "L" level. Thus, all the word lines WL are deselected.

At time T14, the control signal NEST is set to the "H" level. As a result, the node N1 is boosted to a negative potential. This further lowers the potentials of the bit lines /BL[0], /BL[1].

Consequently, if any memory cell MC has a retention failure, an access MOS transistor coupled to the associated deselected word line is placed in a state close to conduction. This may cause an unintended current flow to invert stored data.

At time T15, the column address signal CA[0] and the control signal WTE are set to the "L" level. As a result, the transfer gates TG1, TG2 become nonconductive to terminate a data write to a memory cell having a retention failure. A memory cell having a retention failure can be detected by writing data into the memory cell having a retention failure and performing a data read to read the written data.

Performing the above-described process makes it possible to concurrently write data into two columns of memory cells having retention failure.

The test method for the semiconductor memory device is the same as indicated by the timing diagram of FIG. 5.

Therefore, the test method for the semiconductor memory device according to the first modification of the first embodiment expedites the process of writing data into a memory cell having a retention failure. This makes it possible to promptly detect a retention failure.

When the control signal TM is set to the "H" level not only for a data write in the test mode but also for a data write in steps S1 and S6 of FIG. 5, normal data "0" and data "1" can also be rapidly written.

Consequently, using the above method and the test method for the semiconductor memory device according to the first modification of the first embodiment expedites the process of writing data into a memory cell. This makes it possible to promptly detect a retention failure.

Second Modification

Figure 9:
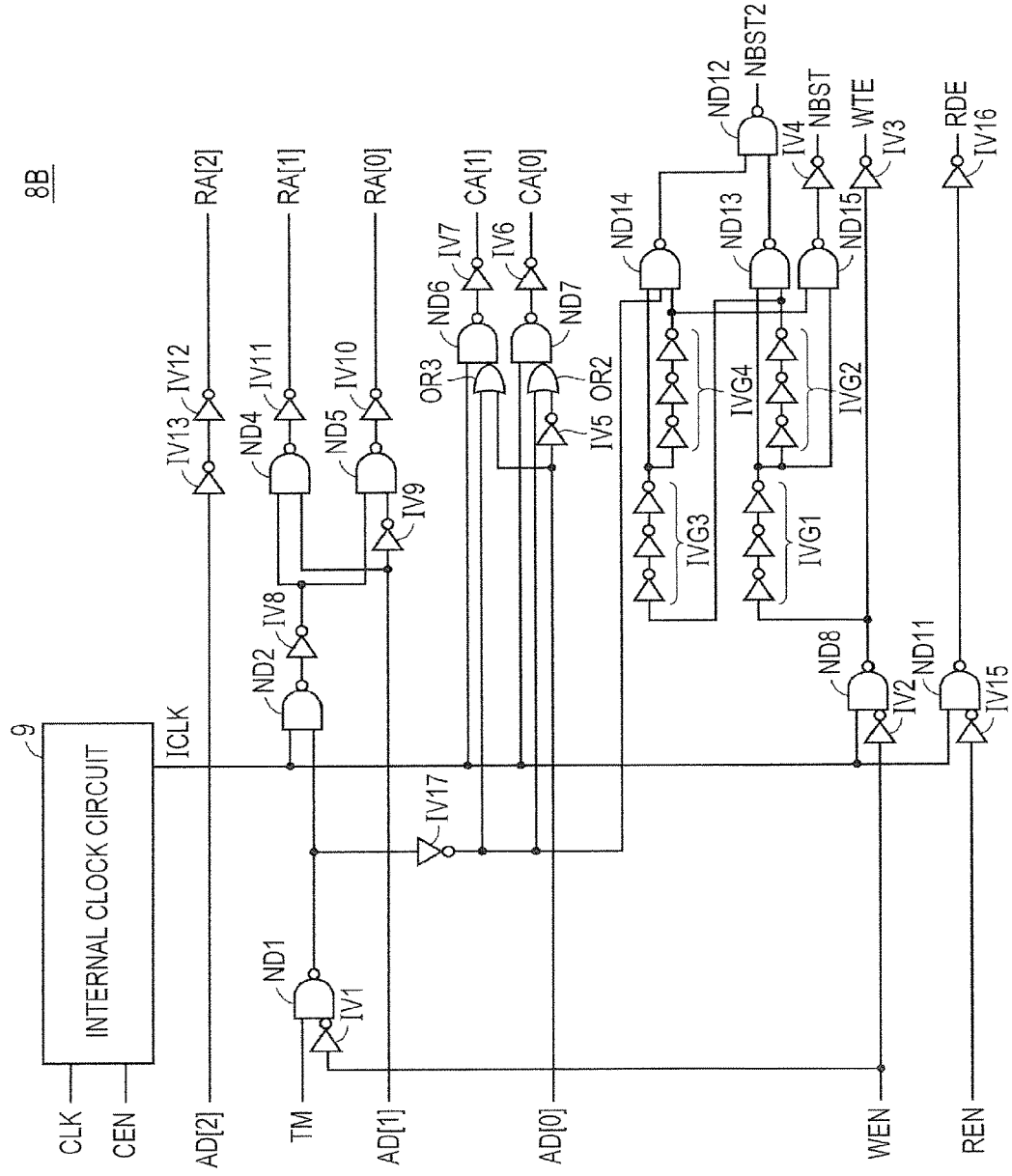
FIG. 9 is a diagram illustrating an internal circuit configuration of the control circuit according to a second modification of the first embodiment.

FIG. 9 is a diagram illustrating an internal circuit configuration of a control circuit 8B according to a second modification of the first embodiment.

Referring to FIG. 9, the control circuit 8B is different from the control circuit 8A in that the former additionally includes NAND circuits ND12-ND14 and inverter groups IVG3, IVG4. The control circuit 8B is also different from the control circuit 8A in that the former includes a NAND circuit ND15 in place of the NAND circuit ND9. The other elements are the same as those described with reference to FIG. 6 and will not be redundantly described in detail.

Upon receipt of an output signal from the inverter group IVG1 and an output signal from the inverter group IVG2, the NAND circuit ND13 NANDs the received signals and outputs the NANDed result to the NAND circuit ND12.

Upon receipt of an output signal from the inverter group IVG1 and an output signal from the inverter group IVG4, the NAND circuit ND15 NANDs the received signals and outputs the NANDed result to the inverter IV4. The inverter IV4 inverts the signal of the NAND circuit ND15 and outputs the inverted signal as the control signal NBST.

Upon receipt of an output signal from the inverter group IVG3, an output signal from the inverter group IVG4, and a signal inverted by the inverter IV17, the NAND circuit ND14 NANDs the received signals and outputs the NANDed result to the NAND circuit ND12.

Upon receipt of an output signal from the NAND circuit ND13 and an output signal from the NAND circuit ND14, the NAND circuit ND12 NANDs the received signals and outputs the NANDed result as a control signal NBST2.

The inverter group IVG1, which includes an odd number of series-coupled inverters, inverts the signal of the NAND circuit ND8 and outputs the inverted signal to the NAND circuit ND13.

The inverter group IVG2, which includes an odd number of series-coupled inverters, inverts an output signal from the inverter group IVG1 and outputs the inverted signal to the NAND circuit ND13.

The inverter group IVG3, which includes an odd number of series-coupled inverters, inverts an output signal from the inverter group IVG2 and outputs the inverted signal to the NAND circuit ND14.

The inverter group IVG4, which includes an odd number of series-coupled inverters, inverts an output signal from the inverter group IVG3 and outputs the inverted signal to the NAND circuit ND14.

It is assumed, for example, that output signal of the NAND circuit ND8 is set to the "H" level by default. In this instance, the output signal of the inverter group IVG1 is at the "L" level. The output signal of the inverter group IVG2 is at the "H" level. Further, the output signal of the inverter group IVG3 is at the "L" level. Furthermore, the output signal of the inverter group IVG4 is at the "H" level.

Consequently, the output signal of the NAND circuit ND15 is set to the "H" level. That is, the control signal NBST, which is an inverse of the output signal of the NAND circuit ND15, is set to the "L" level. The output signal of the NAND circuit ND13 is set to the "H" level. The output signal of the NAND circuit ND14 is set to the "H" level. As a result, the output signal of the NAND circuit ND12 is set to the "L" level. That is, the control signal NBST2 is set to the "L" level.

If, in the above instance, the output signal of the NAND circuit ND8 changes to the "L" level, the output signal of the inverter group IVG1 is set to the "H" level. Meanwhile, with a delay of a predetermined period, the output signal of the inverter group IVG2 is changed from the "H" level to the "L" level. Further, the output signal of the inverter group IVG3 is changed from the "H" level to the "L" level with a delay of a predetermined period after the change in the output signal of the inverter group IVG2. Furthermore, the output signal of the inverter group IVG4 is changed from the "H" level to the "L" level with a delay of a predetermined period after the change in the output signal of the inverter group IVG3.

Consequently, the NAND circuit ND15 outputs an "L" level signal until the delay periods of the inverter groups IVG2, IVG3, IVG4 elapse after the output signal of the inverter group IVG1 is changed to the "H" level. That is, the control signal NBST is set to the "H" level as a one-shot pulse signal based on the delay periods of the inverter groups IVG2, IVG3, IVG4.

When the output signal of the inverter group TVG1 is changed from the "L" level to the "H" level, the NAND circuit ND13 outputs an "L" level while the output signal of the inverter group IVG2 changes from the "H" level to the "L" level with a delay of the predetermined period.

Upon receipt of an "L" level signal from the NAND circuit ND13, the NAND circuit ND12 sets the control signal NBST2 to the "H" level. That is, the control signal NBST2 is set the "H" level as a one-shot pulse signal based on the delay period of the inverter group IVG2.

Further, after the output signal of the inverter group IVG2 is changed from the "H" level to the "L" level with a delay of the predetermined period, the output signal of the inverter group IVG3 is changed from the "L" level to the "H" level with a further delay of a predetermined period. The output signal of the inverter group IVG4 is then changed from the "H" level to the "L" level with a further delay a predetermined period.

When the output signal of the inverter IV17 is set to the "H" level as the control signal TM is inputted at the "H" level, the NAND circuit ND14 outputs an "L" level to the NAND circuit ND12 while the output signal of the inverter group IVG4 changes from the "H" level to the "L" level with a delay of a predetermined period.

Upon receipt of an "L" level signal from the NAND circuit ND14, the NAND circuit ND12 sets the control signal NBST2 to the "H" level. That is, the control signal NBST2 is set to the "H" level as a one-shot pulse signal based on the delay period of the inverter group IVG4.

When the control signal TM is at the "L" level, the output signal of the inverter IV17 is set to the "L" level. This causes the NAND circuit ND14 to output an "H" level to the NAND circuit ND12 without regard to the output signal of the inverter group IVG4.

Consequently, when the control signal TM is at the "H" level in a situation where the control signal NBST is to be set to the "H" level by the above-described method, the control signal NBST2 is set two times as a one-shot, "H" level pulse signal while the control signal NBST is at the "H" level.

When the control signal TM is at the "L" level in a situation where the control signal NBST is to be set to the "H" level by the above-described method, the control signal NBST2 is set once as a one-shot, "H" level pulse signal while the control signal NBST is at the "H" level.

Figure 10:
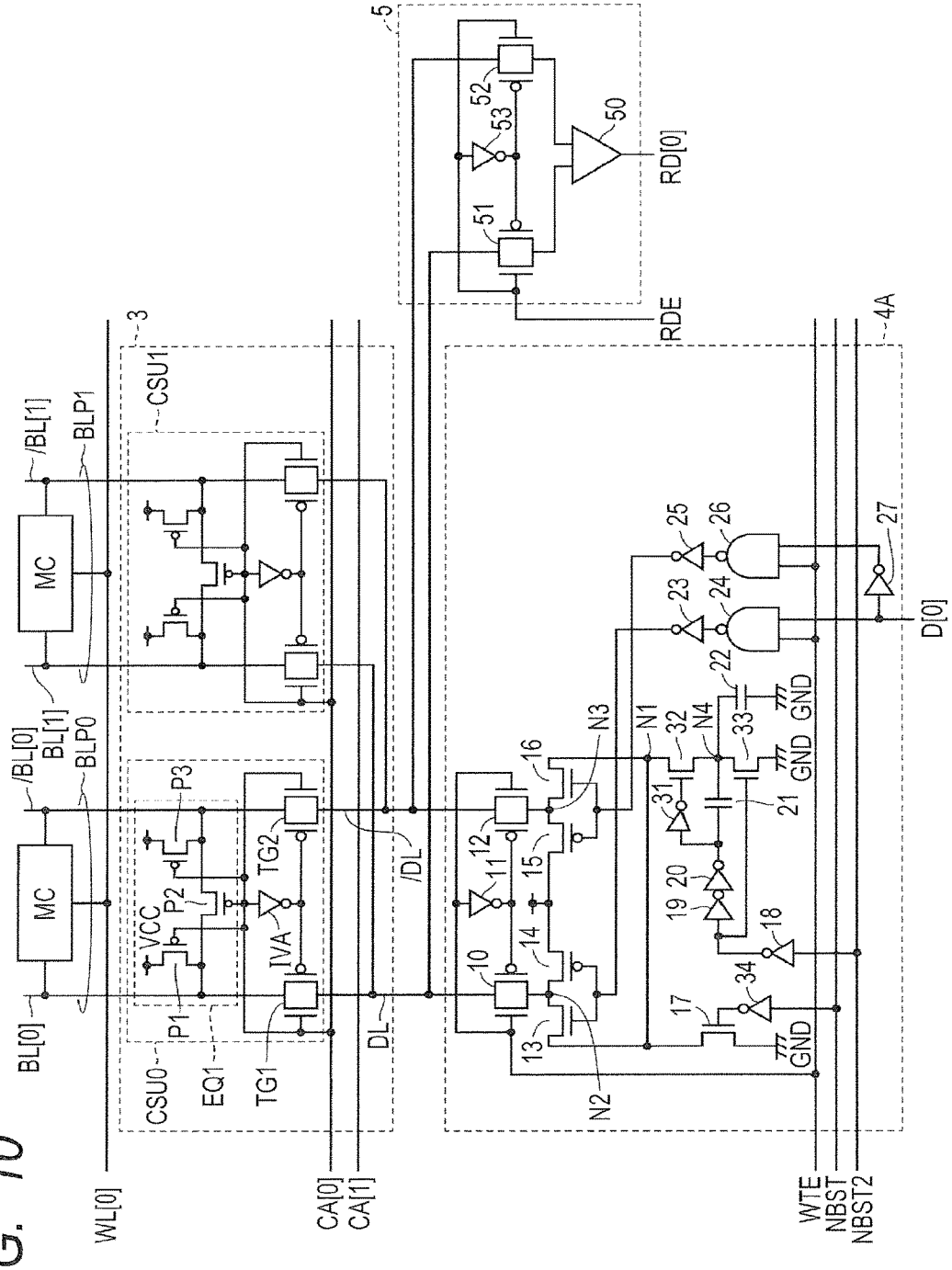
FIG. 10 is a diagram illustrating circuit configurations of the column selective drive circuit, the write circuit, and the read circuit in accordance with the second modification of the first embodiment.

FIG. 10 is a diagram illustrating circuit configurations of the column selective drive circuit 3, a write circuit 4A, and the read circuit 5 in accordance with the second modification of the first embodiment.

Referring to FIG. 10, the write circuit 4A according to the second modification of the first embodiment differs from the write circuit 3 in that the former additionally includes N-channel MOS transistors 32, 33 and inverters 31, 34. The other elements are the same as those described earlier and will not be redundantly described in detail.

Further, upon receipt of the control signal NBST2, the inverter 18 inverts the received signal and outputs the inverted signal to the inverter 19.

The N-channel MOS transistor 17 receives an inverse of the control signal NBST, which is inputted through the inverter 34.

The N-channel MOS transistor 33 is disposed between the ground voltage GND and the node N4. The gate of the N-channel MOS transistor 33 receives the input of an inverse of the control signal NBST2, which is inputted through the inverter 18.

The N-channel MOS transistor 32 is disposed between the node N1 and the node N2. The gate of the N-channel MOS transistor 32 receives the input of an inverse of the output signal of the inverter 20, which is inputted through the inverter 31.

The capacitor 22 is coupled between the node N4 and the ground voltage GND.

The capacitor 21 is disposed between the inverter 20 and the node N4.

The inverters 19, 20 are coupled in series and coupled to the capacitor 21.

During a data write, the control signal WTE is set to the "H" level. Meanwhile, the control signal RDE is set to the "L" level.

When the control signal WTE is at the "H" level and the data D[0] is set to the "L" level, the output signal of the inverter 23 is at the "H" level and the output signal of the inverter 25 is at the "L" level. As a result, the N-channel MOS transistor 13 and the P-channel MOS transistor 15 become conductive. In accordance with the control signal WTE ("H" level), the transfer gates 10, 12 are conductive. Further, as the control signal NBST is set to the "L" level by default, the node N1 is coupled to the ground voltage GND.

Therefore, the data line DL is coupled to the ground voltage GND through the node N1 and set to the "L" level. Meanwhile, the data line /DL is coupled to the power supply voltage VCC and set to the "H" level.

When the control signal WTE is at the "H" level and the data D[0] is set to the "L" level, the output signal of the inverter 25 is at the "H" level and the output signal of the inverter 23 is at the "L" level. As a result, the N-channel MOS transistor 16 becomes conductive. Further, the P-channel MOS transistor 14 becomes conductive. In accordance with the control signal WTE ("H" level), the transfer gates 10, 12 are conductive. Further, as the control signal NBST is set to the "L" level by default, the node N1 is coupled to the ground voltage GND. Therefore, the data line DL is coupled to the power supply voltage VCC and set to the "H" level. The data line /DL is coupled to the ground voltage GND through the node N1 and set to the "L" level.

When, in this instance, the control signal NBST is set to the "H" level, the inverter 34 makes the N-channel MOS transistor 17 nonconductive, thereby placing the node N1 in a floating state.

When the control signal NBST2 is at the "L" level, the output signal of the inverter 18 is set to the "H" level so that the N-channel MOS transistor 33 is conductive. Therefore, the capacitor 21 is coupled to the ground voltage GND.

Next, when the control signal NBST2 is set to the "H" level, the inverter 18 outputs an "L" level. As a result, the N-channel MOS transistor 33 becomes nonconductive.

Subsequently, the output of the inverter 20 is set to the "L" level. The node N4 is boosted to a negative potential through the capacitor 21. Further, in accordance with a signal inverted by the inverter 20, the N-channel MOS transistor 32 becomes conductive through the inverter 31. As a result, the potential of the node N4, which is boosted to a negative potential, lowers the potential of a data line coupled to the node N1.

Consequently, the gate-source voltage Vgs of the access transistor AT in a memory cell increases to increase the current drive capability of the access transistor AT, thereby further raising the potential of a storage node. The other storage node is raised to the "H" level to accelerate the inversion of the storage node. This makes it possible to perform a high-speed, stable data write.

Figure 11:
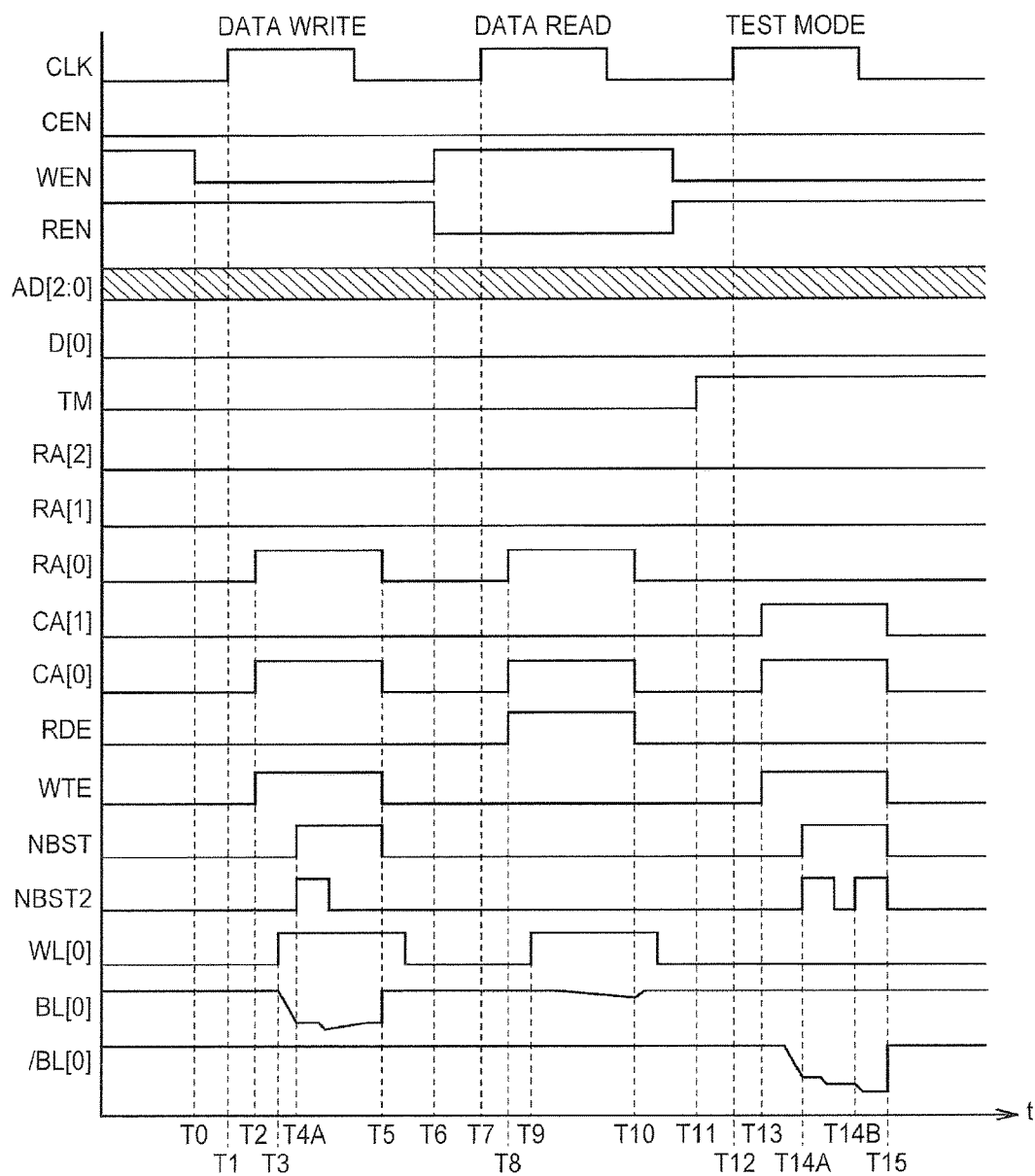
FIG. 11 is a timing diagram illustrating the signal relationship between memory array data write, data read, and test mode in accordance with the second modification of the first embodiment.

FIG. 11 is a timing diagram illustrating the signal relationship between memory array data write, data read, and test mode in accordance with the second modification of the first embodiment.

Referring to FIG. 11, the data read is the same as depicted in FIG. 5.

Specifically, the data write at time T4A is different from the data write depicted in FIG. 5.

At time T4A, the control signal NBST is set to the "H" level. Further, the control signal NBST2 is set to the "H" level. As a result, the node N1 is boosted to a negative potential. This further lowers the potential of the bit line /BL[0], thereby providing assistance to a data write.

At time T5, the row address signal RA[0], the column address signal CA[0], and the control signal WTE are set to the "L" level.

Consequently, the transfer gates TG1, TG2 become nonconductive to terminate a data write.

Moreover, the test mode is specifically different from the test mode depicted in FIG. 5 at time T14A and at time T14B.

At time T14A, the control signal NBST is set to the "H" level. Further, the control signal NBST2 is set to the "H" level. As a result, the node N1 is boosted to a negative potential. This further lowers the potential of the bit line /BL[0], thereby providing assistance to a data write.

At time T14B, the control signal NBST2 is set to the "H" level. As a result, the node N1 is boosted to a lower negative potential. This further lowers the potential of the bit line /BL[0], thereby providing further assistance to a data write.

That is to say, a one-shot pulse control signal NBST2 is inputted twice to provide assistance to a data write twice.

Consequently, if any memory cell MC has a retention failure, an access MOS transistor coupled to the associated deselected word line is placed in a state close to conduction. Particularly, when the potential of a bit line is decreased to a lower negative potential, a test can be conducted under more stringent conditions (under a high load).

The present example has described a method of providing assistance to a data write two times. Alternatively, however, assistance may be provided to a data write multiple times for the purpose of conducting a test to detect a memory cell having a retention failure under more stringent conditions.

The present example has described a method of providing assistance in the test mode to a data write two times. Alternatively, however, assistance may be provided to a regular data write multiple times.

Third Modification

Figure 12:
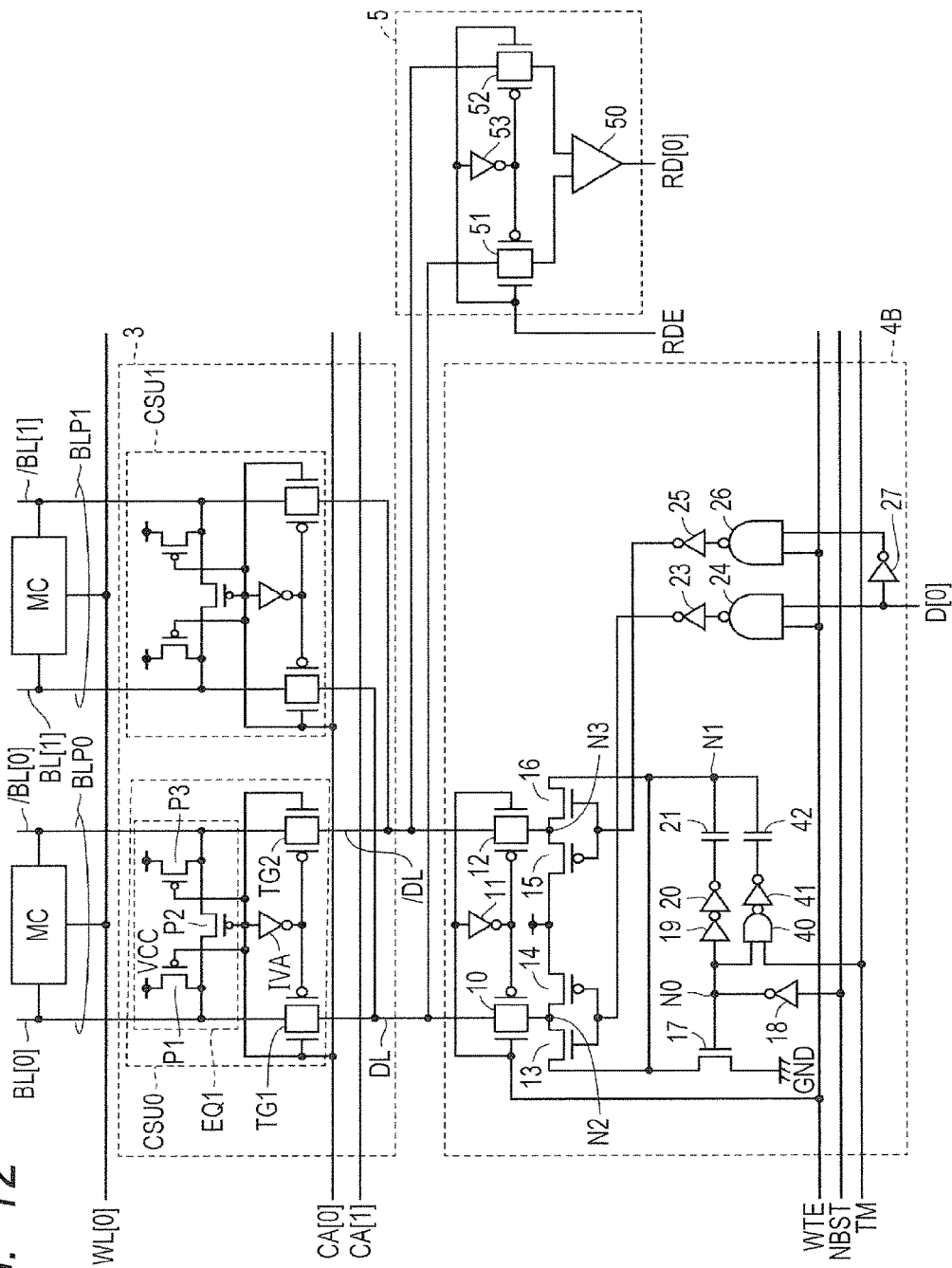
FIG. 12 is a diagram illustrating circuit configurations of the column selective drive circuit, the write circuit, and the read circuit in accordance with a third modification of the first embodiment.

FIG. 12 is a diagram illustrating circuit configurations of the column selective drive circuit 3, a write circuit 4B, and the read circuit 5 in accordance with a third modification of the first embodiment.

Referring to FIG. 12, the write circuit 4B according to the third modification of the first embodiment differs from the write circuit 4 in that the former additionally includes a NAND circuit 40, an inverter 41, and a capacitor 42. The other elements are the same as those described earlier and will not be redundantly described in detail.

Upon receipt of the signal of the node N0 and the control signal TM, the NAND circuit 40 NANDs the received signals and outputs the NANDed result to the inverter 41.

The inverter 41 inverts the signal of the NAND circuit 40 and outputs the inverted signal to the capacitor 42.

The capacitor 42 is disposed between the node N1 and the inverter 41.

When the control signal TM is set to the "H" level, the NAND circuit 40 outputs an "L" level to the inverter 41 in accordance with the potential of the node N0.

The inverter 41 inverts an inputted signal and outputs the inverted signal to the capacitor 42.

In the initial state where the control signal NBST is at the "L" level, the node N0 is set at the "H" level.

Consequently, when the control signal TM is set to the "H" level, the output of the NAND circuit 40 is set to the "L" level. The inverter 41 then inverts an inputted signal and outputs the inverted signal ("H" level) to the capacitor 42.

Subsequently, when the control signal NBST is set to the "H" level, the output of the NAND circuit 40 is set to the "H" level. The inverter 41 then inverts an inputted signal and outputs the inverted signal ("L" level) to the capacitor 42. This causes the node N1 to be boosted to a negative potential through the capacitor 42. Further, the node N1 is boosted to a negative potential through the capacitor 21.

Consequently, if the control signal TM is at the "L" level, boosting to a negative potential is performed by using the capacitor 21. If, by contrast, the control signal TM is at the "H" level, boosting to a negative potential is performed by using the capacitors 21, 42.

That is to say, the test mode permits the potential of the node N1 to be decreased to a lower negative potential than during a regular data write.

The present example has described a configuration including the capacitor 42. Alternatively, however, the configuration may include a plurality of capacitors in order to adjust the level to which the negative potential is to be lowered.

The present example has described a configuration that uses the capacitor 42 in the test mode. Alternatively, however, the configuration may include a switch element that becomes conductive in the test mode to couple the capacitor 42 to the capacitor 21 in parallel.

Second Embodiment

Figure 13:
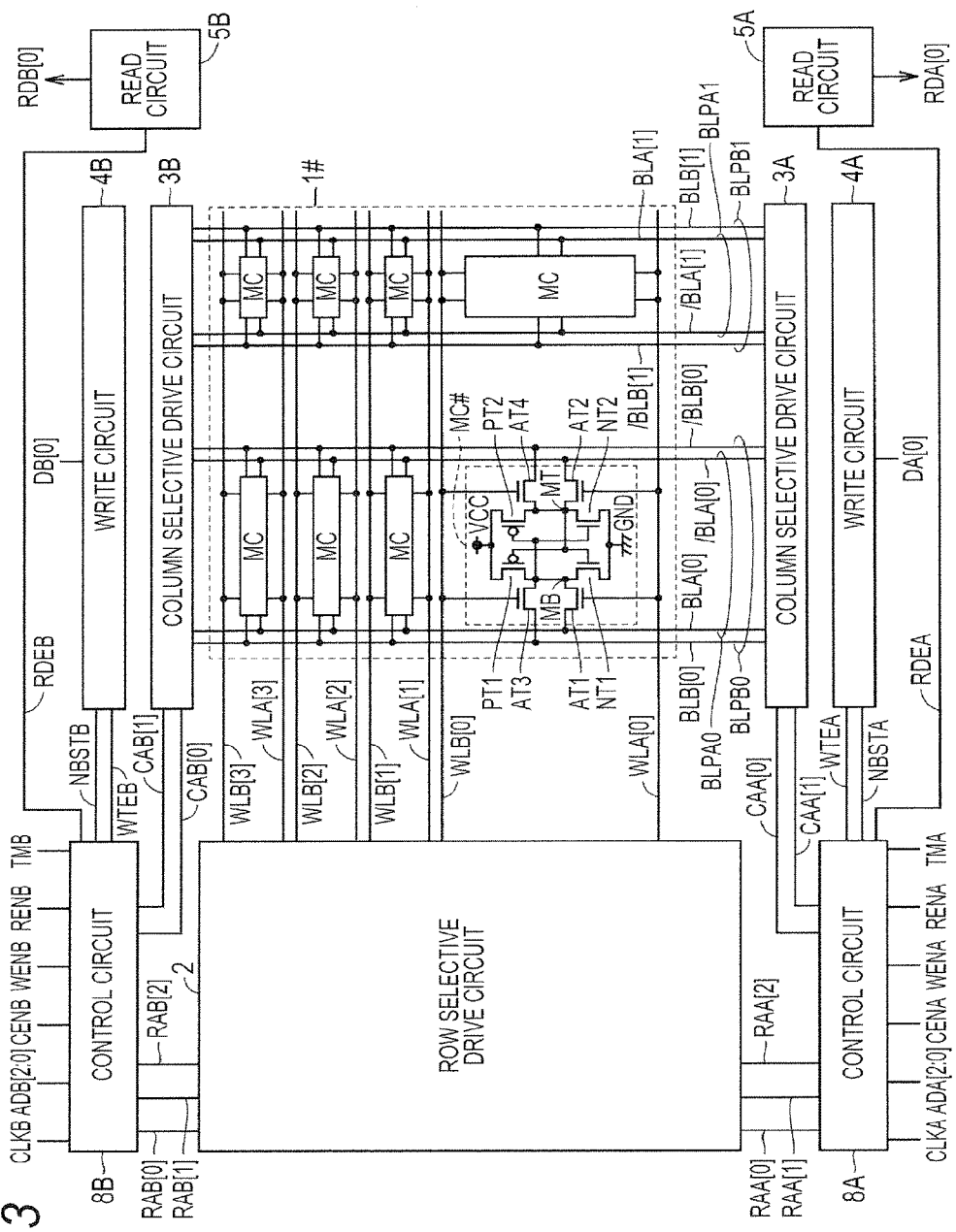
FIG. 13 is an external view illustrating a configuration of the semiconductor memory device according to a second embodiment of the present disclosure.

FIG. 13 is an external view illustrating a configuration of the semiconductor memory device according to a second embodiment of the present disclosure.

As illustrated in FIG. 13, the semiconductor memory device includes a memory array 1#, a row selective drive circuit 2, column selective drive circuits 3A, 3B, write circuits 4A, 4B, read circuits 5A, 5B, and control circuits 8A, 8B.

The memory array 1# includes a plurality of memory cells MC# that are disposed in a matrix forth.

The memory array 1# includes a plurality of word lines WLA, WLB and a plurality of bit line pairs BLPA, BLPB. The word lines WLA, WLB are respectively disposed in memory cell rows. The bit line pairs BLPA, BLPB are respectively disposed in memory cell columns.

The bit line pairs ELBA each include a bit line BLA and a bit line /BLA.

The bit line pairs ELBE each include a bit line BLB and a bit like /BLB.

The present example depicts the word lines WLA[0]-WLA[2] and the bit line pairs BLPA0, BLPA1, BLPB0, BLPB1. The word lines WLA[0]-WLA[2] are respectively disposed in three memory cell rows. The bit line pairs BLPA0, BLPA1, BLPB0, BLPB1 are respectively disposed in two memory cell columns. Some additional rows and columns of memory cells may be disposed.

The bit line pair BLPA0 includes a bit line BLA[0] and a bit line /BLA[0]. The bit line pair BLPA1 includes a bit line BLA[1] and a bit line /BLA[1] The bit line pair BLPB0 includes a bit line BLB[0] and a bit line /BLB[0]. The bit line pair BLPB1 includes a bit line BLB[1] and a bit line /BLB[1].

Each memory cell MC# is a rewritable SRAM (static random-access memory) cell. Each memory cell MC# is a two-port memory cell and different from the memory cells MC.

Each memory cell MC# is a static memory cell that is formed of a drive transistor, a transfer transistor, and a load element. More specifically, each of the depicted memory cells MC# is an 8-transistor SRAM cell including four access transistors AT1-AT4 (transfer transistors), drive transistors NT1, NT2, and load transistors PT1, PT2 (load elements).

The access transistors AT1, AT2 are electrically coupled to the associated word line WLA. The access transistors AT1, AT2 become conductive in accordance with the word line WLA that is activated when a data read or a data write is performed on a memory cell MC# at port A.

The access transistors AT3, AT4 are electrically coupled to the associated word line WLB. The access transistors AT3, AT4 become conductive in accordance with the word line WLB that is activated when a data read or a data write is performed on a memory cell MC# at port B.

The load transistor PT1 and the drive transistor NT1 are coupled between the power supply voltage VCC and the ground voltage GND.

The load transistor PT2 and the drive transistor NT2 are coupled between the power supply voltage VCC and the ground voltage GND.

The gate of the load transistor PT1 and the gate of the drive transistor NT1 are both coupled to the storage node MT, which is a connection node for the load transistor PT2 and the drive transistor NT2. The access transistor AT2 is disposed between the storage node MT and the bit line /BL[0]. The gate of the access transistor AT2 is coupled to the word line WLA[0].

The gate of the load transistor PT2 and the gate of the drive transistor NT2 are both coupled to the storage node MB, which is a connection node for the load transistor PT1 and the drive transistor NT1. The access transistor AT1 is disposed between the storage node MB and the bit line BL[0]. The gate of the access transistor AT1 is coupled to the word line WLB[0].

The configurations of the other memory cells MC# are basically the same as described above.

The row selective drive circuit 2A drives (selects) a word line WLA in accordance with row address signals RAA[0]-RAA[2] inputted from the control circuit 8.

The row selective drive circuit 2B drives (selects) a word line WLB in accordance with row address signals RAB[0]-RAB[2] inputted from the control circuit 8.

The column selective drive circuit 3A selects a bit line pair BLPA in accordance with column address signals CAA[0], CAA[1] inputted from the control circuit 8.

The column selective drive circuit 3B selects a bit line pair BLPB in accordance with column address signals CAB[0], CAB[1] inputted from the control circuit 8.

The write circuit 4A drives a bit line pair BLPA in a column that is selected by the column selective drive circuit 3A in accordance with a control signal WTEA, a control signal NBSTA, and write data DA[0].

For example, the bit line BLA[0] is set to the "H" level (power supply voltage VCC) in accordance with the write data DA[0], and the bit line /BLA[0] is set to the "L" level (ground voltage GND). Further, the bit line /BLA[0] is set to a negative potential in accordance with the control signal NBSTA.

The write circuit 4B drives a bit line pair BLPB in a column that is selected by the column selective drive circuit 3B in accordance with a control signal WTEB, a control signal NBSTB, and write data DB[0].

For example, the bit line BLB[0] is set to the "H" level (power supply voltage VCC) in accordance with the write data DB[0], and the bit line /BLB[0] is set to the "L" level (ground voltage GND). Further, the bit line /BLB[0] is set to a negative potential in accordance with the control signal NBSTB.

The read circuit 5A reads data in a memory cell MC# coupled to a bit line pair BLPA in a column that is selected by the column selective drive circuit 3A in accordance with a control signal RDEA. During a data read, for example, the bit lines BLA, /BLA of a bit line pair BLPA are both set to the "H" level (power supply voltage VCC). When a word line WLA is selected, the access transistors AT1, AT2 become conductive so that the potentials of the bit lines BLA, /BLA change in accordance with the data retained by the memory cell MC#. The read circuit 5A detects a potential difference between the bit lines BLA, /BLA of the bit line pair BLPA, amplifies the detected potential difference, and outputs the amplified result as read data RDA[0].

The read circuit 5B reads data in a memory cell MC# coupled to a bit line pair BLPB in a column that is selected by the column selective drive circuit 3B in accordance with a control signal RDEA. During a data read, for example, the bit lines BLB, /BLB of a bit line pair BLPB are both set to the "H" level (power supply voltage VCC). When a word line WLB is selected, the access transistors AT3, AT4 become conductive so that the potentials of the bit lines BLB, /BLB change in accordance with the data retained by the memory cell MC#. The read circuit 5B detects a potential difference between the bit lines BLB, /BLB of the bit line pair BLPB, amplifies the detected potential difference, and outputs the amplified result as read data RDE[0].

The control circuit 8A operates in accordance with a clock signal CLKA, an address signal ADA[2:0], and control signals CENA, WENA, RENA, TMA.

More specifically, the control circuit 8A is activated for port A in accordance with the control signal CENA and operates in synchronism with the clock signal CLKA. As described later, the control circuit 8A generates a row address signal RAA and a column address signal CAA in accordance with a 3-bit address signal ADA[2:0]. The control circuit 8A performs a data write in accordance with the control signal WENA and activates the control signal WTEA. The control circuit 8A performs a data read in accordance with the control signal RENA and activates the control signal RDEA. The control signal 8A sets a test mode in accordance with the control signal TMA. In the present example, the test mode performs a data write to a memory cell having a retention failure.

The control circuit 8B operates in accordance with a clock signal CLKB, an address signal ADB[2:0], and control signals CENB, WENB, RENB, TMB.

More specifically, the control circuit 8B is activated for port B in accordance with the control signal CENB and operates in synchronism with the clock signal CLKB. As described later, the control circuit 8B generates a row address signal RAB and a column address signal CAB in accordance with a 3-bit address signal ADD[2:0]. The control circuit 8B performs a data write in accordance with the control signal WENB and activates the control signal WTEB. The control circuit 8B performs a data read in accordance with the control signal RENB and activates the control signal RDEB. The control signal 8B sets a test mode in accordance with the control signal TMB. In the present example, the test mode performs a data write to a memory cell having a retention failure.

Operations performed at the individual ports are the same as those described in conjunction with the first embodiment and will not be redundantly described in detail. Port A and port B differ in the symbol. For example, the symbol "A" is attached to a circuit at port A, and the symbol "B" is attached to a circuit at port B. Circuit configurations are basically the same as those described in conjunction with the first embodiment.

Figure 14:
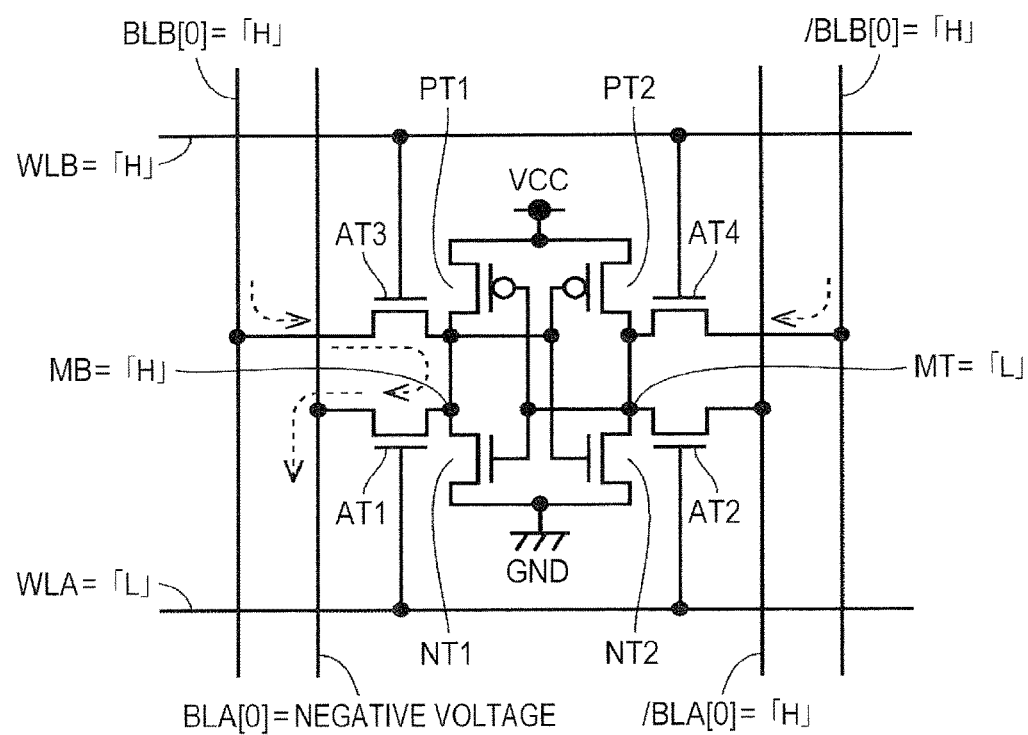
FIG. 14 is a diagram illustrating a memory cell having a retention failure in accordance with the second embodiment.

FIG. 14 is a diagram illustrating a memory cell MC# having a retention failure in accordance with the second embodiment.

The following describes a case where the bit line BLA[0] is set to a negative potential, the bit line /BLA[0] is set to the "H" level, and the bit lines BLB[0], /BLB[0] are set to the "H" level as illustrated in FIG. 14. More specifically, FIG. 14 illustrates a case where a data write is performed to write data "1" from port A. The memory cell MC# is in a state where data "0" is retained. The storage node MB is set to the "H" level. The storage node MT is set to the "L" level.

The word line WLA is set to the "L" level, and the word line WLB is set to the "H" level.

If the access transistor AT1 becomes conductive as a memory cell having a retention failure, a path is formed from the bit line BLB[0] to the bit line BLA[0]. Then, it is conceivable that the storage node MB may change from the "H" level to the "L" level.

The above may cause an unintended current flow to invert stored data.

Figure 15:
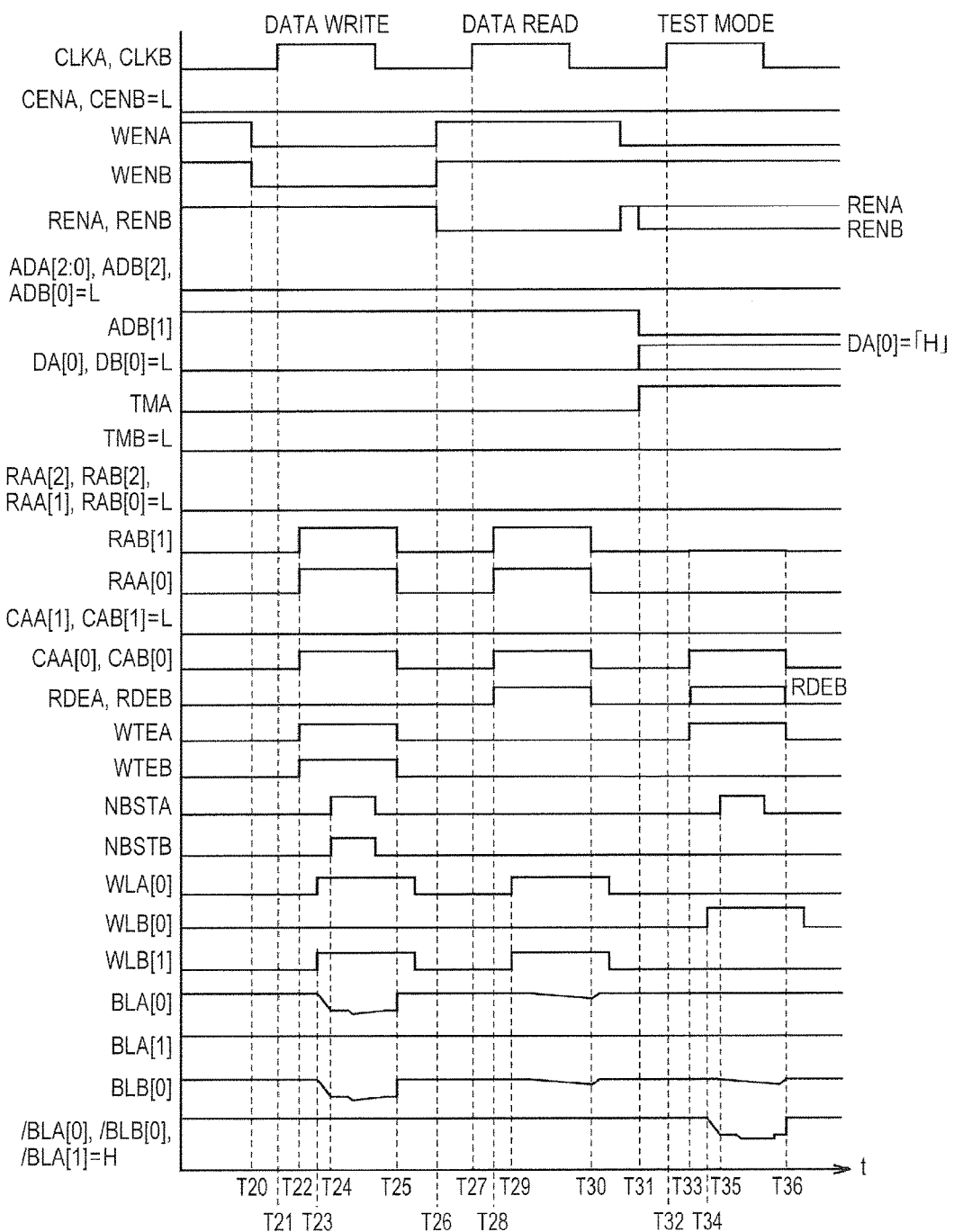
FIG. 15 is a timing diagram illustrating the signal relationship between memory array data write, data read, and test mode in accordance with the second embodiment.

FIG. 15 is a timing diagram illustrating the signal relationship between memory array data write, data read, and test mode in accordance with the second embodiment.

Referring to FIG. 15, the clock signals CLKA, CLKB are inputted at predetermined clock intervals. FIG. 15 depicts a case where the control signals CENA, CENB are set to the "L" level.

During a data write, the control signals WENA, WENB are set at time T20 to the "L" level. At time T21, the clock signals CLKA, CLKB are set to the "H" level.

In the present example, the address signal ADA[2:0] is set to the "L" level. The address signal ADA[0] is set to the "L" level, and the address signals ADA[1], ADA[2] are set to the "L" level. A data signal DA[0] is set to the "L" level.

Further, in the present example, the address signal ADB[2] is set to the "L" level, the address signal ADB[1] is set to the "H" level, and the address signal ADB[0] is set to the "L" level.

Consequently, the row address signal RAA[0] is set at time T22 to the "H" level. Further, the column address signal CAA[0] is set to the "H" level. Furthermore, as the control signal WENA is changed to the "L" level, the control WTEA is set to the "H" level.

Further, the row address signal RAB[1] is set to the "H" level. Furthermore, the column address signal CAB[0] is set to the "H" level. Moreover, as the control signal WENB changes to the "L" level, the control signal WTEB is set to the "H" level.

As the column address signal CAA[0] is set to the "H" level, the column selective drive circuit 3A selects a column selection gate unit at port A. More specifically, a data line DLA at port A is coupled to the bit line BLA[0], and a data line /DLA is coupled to the bit line /BLA[0].

As the control signal WTEA is set to the "H" level, the transfer gates 10, 12 become conductive. Further, as the data signal DA[0] is set to the "L" level, the inverter 23 is set to the "L" level. The inverter 25 is set to the "H" level. As a result, the P-channel MOS transistor 14 becomes conductive, and the N-channel MOS transistor 16 becomes conductive. Thus, the bit line BLA[D] is coupled to the power supply voltage WC through the data line DLA and set to the "H" level. Further, the bit line /BLA[0] is coupled to the ground voltage GND through the data line /DLA and set to the "L" level.

Subsequently, at time T23, the word line WLA[0] is set to the "H" level as the row address signal RAA[0] is set to the "H" level.

Consequently, a data write is performed on a memory cell MC# that is coupled to the word line WLA[0]. More specifically, the storage node MB is set to the "H" level, and the storage node MT is set to the "L" level.

Subsequently, at time T24, the control signal NBSTA is set to the "H" level. As a result, the node N1 is boosted to a negative potential. This further lowers the potential of the bit line /BLA[0], thereby providing assistance to a data write.

At time T25, the row address signal RAA[0], the column address signal CAA[0], and the control signal WTEA are set to the "L" level.

Consequently, the transfer gates TG1, TG2 become non-conductive to terminate a data write at port A.

As the column address signal CAB[0] is set to the "H" level, the column selective drive circuit 3B selects a column selection gate unit at port B. More specifically, a data line DLB at port B is coupled to the bit line BLB[0], and a data line /DLB is coupled to the bit line /BLB[0].

As the control signal WTEB is set to the "H" level, the transfer gates 10, 12 become conductive. Further, as the data signal DB[0] is set to the "L" level, the inverter 23 is set to the "L" level. The inverter 25 is set to the "H" level. As a result, the P-channel MOS transistor 14 becomes conductive, and the N-channel MOS transistor 16 becomes conductive. Thus, the bit line BLB[0] is coupled to the power supply voltage VCC through the data line DLB and set to the "H" level. Further, the bit line /BLB[0] is coupled to the ground voltage GND through the data line /DLB and set to the "L" level.

Subsequently, at time T23, the word line WLB[1] is set to the "H" level as the row address signal RAB[1] is set to the "H" level.

Consequently, a data write is performed on a memory cell MC# that is coupled to the word line WLB[1]. More specifically, the storage node MB is set to the "H" level, and the storage node MT is set to the "L" level.

Subsequently, at time T24, the control signal NBSTB is set to the "H" level. As a result, the node N1 is boosted to a negative potential. This further lowers the potential of the bit line /BLB[0], thereby providing assistance to a data write.

At time T25, the row address signal RAB[1], the column address signal CAB[0], and the control signal WTEB are set to the "L" level.

Consequently, the transfer gates TG1, TG2 become non-conductive to terminate a data write at port B.

A data write can be performed independently at port A and at port B.

Subsequently, during a data read, the control signals WENA, WENB are set at time T26 to the "H" level. Further, the control signals RENA, WRNB are set to the "L" level.

At time T27, the clock signals CLKA, CLKB are set to the "H" level. Further, in the present example, the address signal ADA[2:0] is set to the "L" level. The address signal ADA[0] is set to the "L" level, and the address signals ADA[1], ADA[2] are set to the "L" level. The data signal DA[0] is set to the "L" level.

Further, in the present example, the address signal ADB[2] is set to the "L" level, the address signal ADB[1] is set to the "H" level, and the address signal ADB[0] is set to the "L" level.

Consequently, the row address signal RAA[0] is set at time T28 to the "H" level. The column address signal CAA[0] is set to the "H" level. The control signal RDEA is set to the "H" level. The row address signal RAB[1] is set to the "H" level. The column address signal CAB[0] is set to the "H" level. The control signal RDEB is set to the "H" level.

As the column address signal CAA[0] is set to the "H" level, the column selective drive circuit 3A selects a column selection gate unit at port A. More specifically, the data line DLA at port A is coupled to the bit line BLA[0], and the data line /DLA is coupled to the bit line /BLA[0].

In accordance with the control signal RDEA ("H" level), the transfer gates 51, 52 become conductive. This electrically couples a sense amplifier 50A to the data lines DLA, /DLA.

Then, at time T29, the word line WLA[0] is set to the "H" level as the row address signal RAA[0] is set to the "H" level.

A data read is then performed on a memory cell MC# that is coupled to the word line WLA[0]. More specifically, the potential level of the data line /DLA coupled to the storage node MT lowers. Meanwhile, the potential level of the data line DLA coupled to the storage node MB remains unchanged. Based on the potential difference between the data lines DLA, /DLA, the sense amplifier 50A outputs the data stored in the memory cell MC# as the read data RDA[0]. In the present example, the read data RDA[0] is at the "L" level when outputted.

Subsequently, at time T30, the row address signal RAA[0] and the column address signal CAA[0] are set to the "L" level. Further, the control signal RDEA is set to the "L" level.

Consequently, the transfer gates TG1, TG2, 51, 52 become nonconductive to terminate a data read at port A.

As the column address signal CAB[0] is set to the "H" level, the column selective drive circuit 3B selects a column selection gate unit at port B. More specifically, the data line DLB at port B is coupled to the bit line BLB[0], and the data line /DLB is coupled to the bit line /BLB[0].

In accordance with the control signal RDEB ("H" level), the transfer gates 51, 52 become conductive. This electrically couples a sense amplifier 50B to the data lines DLB, /DLB.

Then, at time T29, the word line WLB[1] is set to the "H" level as the row address signal RAB[1] is set to the "H" level.

A data read is then performed on a memory cell MC# that is coupled to the word line WLB[1]. More specifically, the potential level of the data line /DLB coupled to the storage node MT lowers. Meanwhile, the potential level of the data line DLB coupled to the storage node MB remains unchanged. Based on the potential difference between the data lines DLB, /DLB, the sense amplifier 50B outputs the data stored in the memory cell MC# as the read data RDB[0]. In the present example, the read data RDB [0] is at the "L" level when outputted.

Subsequently, at time T30, the row address signal RAD[0] and the column address signal CAB[0] are set to the "L" level. Further, the control signal RDEB is set to the "L" level.

Consequently, the transfer gates TG1, TG2, 51, 52 become nonconductive to terminate a data read at port B.

The test mode will now be described.

In the present embodiment, the test mode performs a data write to a memory cell MC# having a retention failure. At port A, an "H" level data write is performed. Meanwhile, a dummy data read is performed at port B.

At time T31, the control signal TMA is set to the "H" level. Further, the control signal TMB is set to the "L" level. Further, the control signal WENA is set to the "L" level. The control signal WENB is set to the "H" level. Furthermore, the control signal RENB is set to the "L" level. The control signal RENA is set to the "H" level.

At time T32, the clock signals CLKA, CLKB are set to the "H" level. Further, in the present example, the address signal ADA[2:0] is set to the "L" level. The address signal ADA[0] is set to the "L" level, and the address signals ADA[1], ADA[2] are set to the "L" level. The data signal DA[0] is set to the "H" level.

Further, in the present example, the address signal ADB [2:0] is set to the "L" level. The address signal ADB[0] is set to the "L" level, the address signal ADB[1] is set to the "L" level, and the address signal ADB[2] is set to the "L" level.

At time T33, the column address signal CAA[0] is set to the "H" level in accordance with the address signal ADA[0] ("L" level). Further, as the control signal WENA changes to the "L" level, the control signal WTEA is set to the "H" level. Furthermore, the column address signal CAB[0] is set to the "H" level in accordance with the address signal ADB[0] ("L" level). Moreover, the control signal RDEB is set to the "H" level.

As the column address signal CAA[0] is set to the "H" level, the column selective drive circuit 3A selects a column selection gate unit at port A. More specifically, the data line DLA at port A is coupled to the bit line BLA[0], and the data line /DLA is coupled to the bit line /BLA[0].

As the control signal WTEA is set to the "H" level, the transfer gates 10, 12 become conductive. Further, as the data signal DA[0] is set to the "H" level, the inverter 23 is set to the "H" level. The inverter 25 is set to the "L" level. As a result, the P-channel MOS transistor 15 becomes conductive, and the N-channel MOS transistor 13 becomes conductive. Thus, the bit line BLA[0] is coupled to the ground voltage GND through the data line DLA and set to the "L" level. Further, the bit line /BLA[0] is coupled to the power supply voltage VCC through the data line /DLA and set to the "H" level.

Meanwhile, in accordance with the "H" level of the control signal TMA, the row address signals RAA[0], RAA [1] are both set to the "L" level. Thus, all the word lines WLA are deselected.

At time T35, the control signal NBSTA is set to the "H" level. As a result, the node N1 is boosted to a negative potential. This further lowers the potential of the bit line BLA[0].

Additionally, at the same time, a dummy data read is performed from port B.

As the column address signal CAB[0] is set to the "H" level, the column selective drive circuit 3B selects a column selection gate unit at port B. More specifically, the data line DLB at port B is coupled to the bit line BLB[0], and the data line /DLB is coupled to the bit line /BLB[0].

In accordance with the control signal RDEB ("H" level), the transfer gates 51, 52 become conductive. This electrically couples the sense amplifier 50B to the data lines DLB, /DLB.

Then, at time T34, the word line WLB[0] is activated as the row address signal RAB[0] is set to the "H" level and the row address signal RAB[2] is set to the "L" level.

A dummy data read is then performed on a memory cell MC# that is coupled to the word line WLB[0].

Thus, the resulting state is as described with reference to FIG. 14.

Consequently, if any memory cell MC# has a retention failure, an access MOS transistor coupled to the associated deselected word line is placed in a state close to conduction. This may cause an unintended current flow to invert stored data.

Next, at time T36, the column address signal CAA[0] is set to the "L" level. Further, the control signal WTEA is set to the "L" level. As a result, the transfer gates TG1, TG2 become nonconductive to terminate a test mode data write from port A. Moreover, the column address signal CAB[0]

is set to the "L" level. Additionally, the control signal RDEB is set to the "L" level. This makes the transfer gates TG1, TG2, 51, 52 nonconductive, thereby terminating a test mode dummy data read from port B.

Retention failure testing is also performed for the other memory cells MC# in the same manner as described above.

Figure 16:
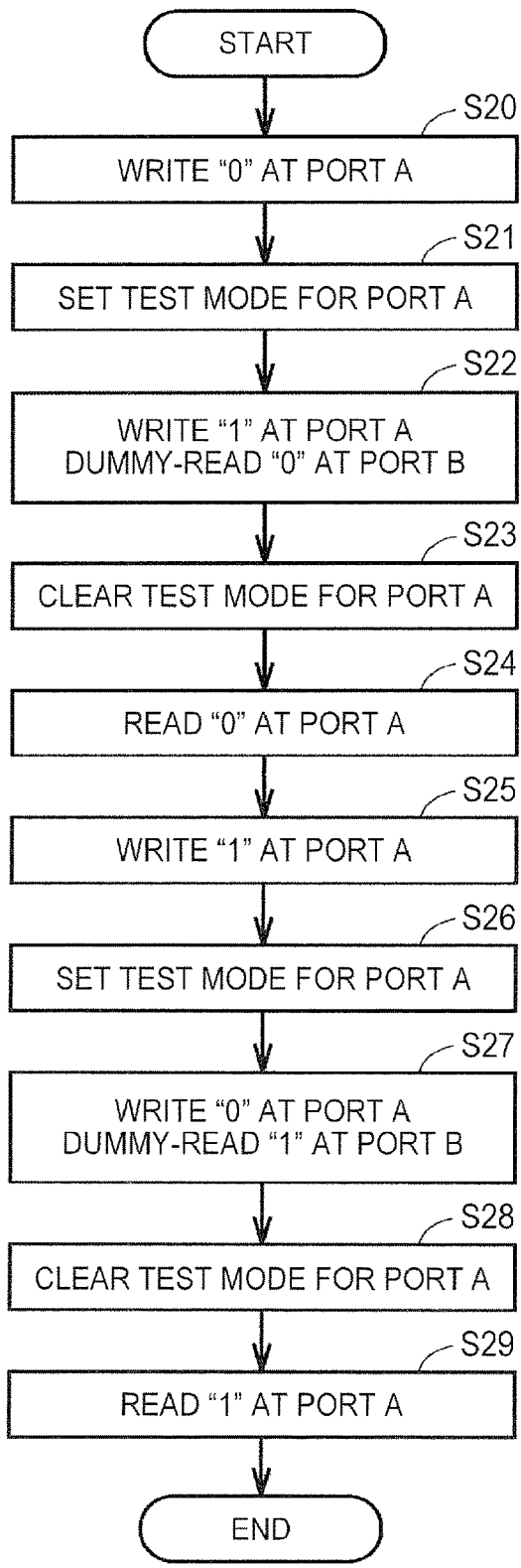
FIG. 16 is a flowchart illustrating a test method for the semiconductor memory device according to the second embodiment.

FIG. 16 is a flowchart illustrating a test method for the semiconductor memory device according to the second embodiment.

Referring to FIG. 15, data "0" is written into a memory cell MC# from port A (step S20).

It is assumed, for example, that data "0" is equivalent to the data signal DA[0] at the "L" level, and that data "1" is equivalent to the data signal DA[0] at the "H" level.

More specifically, the control signal WENA is set to the "L" level as described with reference to FIG. 14. As a result, the control signal WTEA is set to the "H" level.

Further, the address signal ADA[0] is set to the "L" level, and the address signals ADA[1], ADA[2] are both set to the "1" level. As the address signal ADA[0] is set to the "L" level, the column address signal CAA[0] is set to the "H" level and the column address signal CAA[1] is set to the "L" level.

As the column address signal CAA[0] is set to the "H" level, the column selective drive circuit 3A selects a column selection gate unit. The data line DLA is coupled to the bit line BLA[0], and the data line /DLA is coupled to the bit line /BLA[0].

As the control signal WTEA is set to the "H" level, the transfer gates 10, 12 become conductive. Further, as the data signal DA[0] is set to the "L" level, the inverter 23 is set to the "L" level. The inverter 25 is set to the "H" level. As a result, the P-channel MOS transistor 14 becomes conductive, and the N-channel MOS transistor 16 becomes conductive. Thus, the bit line BLA[0] is coupled to the power supply voltage VCC through the data line DLA and set to the "H" Further, the bit line /BLA[0] is coupled to the ground voltage GND through the data line /DLA and set to the "L" level.

When the address signals ADA[1], ADA[2] are at the "L" level, the row address signal RAA[0] is set to the "H" level, and the row address signals RAA[1], RAA[2] are set to the "L" level. As a result, the word line WLA[0] is set to the "H" level as the row address signal RAA[0] is set to the "H" level and the row address signals RAA[1], RAA[2] are set to the "L" level.

Consequently, a data write is performed on a memory cell MC# that is coupled to the word line WLA[0]. More specifically, the storage node MB is set to the "H" level, and the storage node MT is set to the "L" level. Subsequently, the control signal NBST is set to the "H" level. As a result, the node N1 is boosted to a negative potential. This further lowers the potential of the bit line /BLA[0], thereby providing assistance to a data write.

Consequently, data "0" is written into a memory cell MC# that is coupled to the word line WLA[0] and to the bit line pair BLPA0 in the first column. A data write can be similarly performed on the other memory cells MC# by changing the address.

Next, the test mode is set for port A (step S21). More specifically, the control signal TMA is set to the "H" level. Further, the control signal WENA is set to the "L" level. As a result, the control signal WTEA is set to the "H" level.

Data "1" is then written into the memory cell MC# from port A, and a dummy read is performed on the memory cell MC# from port B (step S22).

First of all, the write of data "1" from port A will be described.

Specifically, the address signal ADA[2:0] is set to the "L" level. As the address signal ADA[0] is set to the "L" level, the column address signal CAA[0] is set to the "H" level and the column address signal CAA[1] is set to the "L" level.

As the column address signal CAA[0] is set to the "H" level, the column selective drive circuit 3A selects a column selection gate unit. The data line DLA is coupled to the bit line BLA[0], and the data line /DLA is coupled to the bit line /BLA[0].

As the control signal WTEA is set to the "H" level, the transfer gates 10, 12 become conductive. Further, as the data signal DA[0] is set to the "H" level, the inverter 23 is set to the "L" level. The inverter 25 is set to the "H" level. As a result, the N-channel MOS transistor 13 becomes conductive, and the P-channel MOS transistor 15 becomes conductive. Thus, the bit line BLA[0] is coupled to the ground voltage GND through the data line DLA and set to the "L" level. Further, the bit line /BLA[0] is coupled to the power supply voltage VCC through the data line /DLA and set to the "H" level.

As the control signal TMA is set to the "H" level, the row address signals RAA[0]-RAA[2] are all set to the "L" level without regard to the address signals ADA[1], ADA[2]. As a result, the word lines WLA[0]-WLA[3] are set to the "L" level as the row address signals RAA[0]-RAA[2] are set to the "L" level.

Further, the control signal NBSTA is set to the "H" level. Consequently, the node N1 is boosted to a negative potential. This further lowers the potential of the bit line BLA[0].

The dummy read on the memory cell MC# from port B will now be described.

Specifically, the control signal RENB is set to the "D" level.

In association with a data write in the first column from port A, a data read is performed for port B from the first column.

The address signal ADB[0] is set to the "L" level, and the address signals ADB[1], ADB[2] are set to the "L" level.

When the address signals ADB[1], ADB[2] are both at the "L" level, the row address signal RAB[0] is set to the "H" level. The control signal RDEB is set to the "H" level.

As the address signal ADB[0] is set to the "L" level, the column address signal CAB[0] is set to the "H" level and the column address signal CAB[1] is set to the "L" level.

As the column address signal CAB[0] is set to the "H" level, the column selective drive circuit 3B selects a column selection gate unit. The data line DLB is coupled to the bit line BLB[0], and the data line /DLB is coupled to the bit line /BLB[0].

As the control signal RDEB is set to the "H" level, the transfer gates 51, 52 become conductive. This electrically couples the sense amplifier 50B to the data lines DLB, /DLB.

As the row address signal RAB[0] is set to the "H" level, the word line WLB[0] is set to the "H" level.

Consequently, a dummy data read is performed on a memory cell MC# that is coupled to the word line WLB[0].

A data read performed by using port B is a dummy data read.

Therefore, if a retention failure occurs in a memory cell MC# coupled to the word lines WLA[0], WLB[0], which are coupled to the bit line pair BLPA0 in the first column, the access MOS transistor AT1 coupled to the associated deselected word line is placed in a state close to conduction. This may cause an unintended current flow to invert stored data.

Subsequently, the test mode for port A is cleared (step S23). More specifically, the control signal TMA is set to the "L" level.

Next, data "0" is read from the memory cell MC# (step S24). Data "0" in the memory cell MC#, which was written in step S20, is read. A memory cell MC# having a retention failure can be detected because data "1" is read from such a memory cell MC#.

More specifically, the control signal WENA is set to the "H" level. Further, the control signal RENA is set to the "L" level. Moreover, the address signal ADA[0] is set to the "L" level, and the address signals ADA[1], ADA[2] are set to the "L" level.

When the address signals ADA[1], ADA[2] are both at the "L" level, the row address signal RAA[0] is set to the "H" level. The column address signal CAA[0] is set to the "H" level. The control signal RDEA is set to the "H" level.

As the address signal ADA[0] is set to the "L" level, the column address signal CAA[0] is set to the "H" level and the column address signal CAA[1] is set to the "L" level.

As the column address signal CAA[0] is set to the "H" level, the column selective drive circuit 3A selects a column selection gate unit. The column selective drive circuit 3A couples the data line DLA to the bit line BLA[0] and the data line /DLA to the bit line /BLA[0].

As the control signal RDEA is set to the "H" level, the transfer gates 51, 52 become conductive. This electrically couples the sense amplifier 50A to the data lines DLA, /DLA.

As the row address signal RAA[0] is set to the "H" level, the word line WLA[0] is set to the "H" level.

Consequently, a data read is performed on a memory cell MC# that is coupled to the word line WLA[0].

If the memory cell MC# does not have a retention failure, the potential level of the data line /DLA coupled to the storage node MT lowers. Meanwhile, the potential level of the data line DLA coupled to the storage node MB remains unchanged. Based on the potential difference between the data lines DLA, /DLA, the sense amplifier 50A outputs the data stored in the memory cell MC# as the read data RDA[0]. In the present example, the read data RDA[0] is at the "L" level when outputted.

If, by contrast, a retention failure occurs in the memory cell MC# when the access MOS transistor AT1 becomes conductive, the potential level of the data line DLA coupled to the storage node MB lowers. Meanwhile, the potential level of the data line /DLA coupled to the storage node MT remains unchanged. Based on the potential difference between the data lines DLA, /DLA, the sense amplifier 50A outputs the data stored in the memory cell MC# as the read data RDA[0]. In the present example, the read data RDA[0] is at the "H" level when outputted.

Next, data "1" is written into the memory cell MC# from port A (step S25).

Subsequently, the test mode is set for port A (step S26).

Next, data "0" is written into the memory cell MC# from port A, and a dummy read is performed on the memory cell MC# from port B (step S27).

Subsequently, the test mode for port A is cleared (step S28).

Next, data "1" in the memory cell MC# is read from port A (step S29).

Processing then terminates (ends).

Steps S25 to S29 are similar to steps S20 to S24 and will not be redundantly described in detail. When testing is performed in steps S25 to S29, it is possible to detect a memory cell MC# in which a retention failure occurs when the access MOS transistor AT2 becomes conductive.

The above-described operation is repeatedly performed on the memory cells MC# associated with all addresses.

When the test method according to the second embodiment is employed to perform a data write, setting the test mode makes it possible to maintain the bit lines BL at a negative potential level for memory cells MC# having a retention failure in the individual columns while all the word lines are deselected.

If the read data RDA[0] is at the "L" level when read, the memory cell MC# is determined to be normal and without a retention failure. If, by contrast, the read data RDA[0] is at the "H" level when read, the memory cell MC# is determined to have a retention failure.

Consequently, the test method for the semiconductor memory device according to the second embodiment makes it possible to surely detect a retention failure of a two-port memory cell.

While the present disclosure has been described in terms of embodiments, the present disclosure is not limited to the embodiments. Those skilled in the art will recognize that the present disclosure can be variously modified without departing from the spirit and scope of the present disclosure.

What is claimed is:

1. A test method for a semiconductor memory device having a plurality of memory cells arranged in a matrix form, the test method comprising:
    writing first data into a plurality of memory cells;
    while a plurality of word lines disposed in the columns of the memory cells are deselected, driving the low-potential side bit line of a bit line pair in the selected column, which is among a plurality of bit line pairs disposed in the columns of the memory cells, to a negative voltage level in accordance with second data complementary to the first data;
    and reading the data written into the memory cells.

2. A test method for a semiconductor memory device having a plurality of memory cells arranged in a matrix form, the memory cells each including a first port and a second port that are capable of reading or writing data, the test method comprising:
    writing first data into a memory cell selected from among a plurality of memory cells;
    while a plurality of first word lines disposed at the first port of the columns of the memory cells are deselected and a second word line disposed with respect to a selected memory cell that is disposed at the second port of the columns of the memory cells are selected, driving the low-potential side bit line of a first bit line pair in a selected column, which is among a plurality of first bit line pairs disposed at the first port of the columns of the memory cells, to a negative voltage level in accordance with second data complementary to the first data; and
    reading the data written into the selected memory cell.

3. The test method according to claim 1,
    wherein each of the memory cells is coupled between a first voltage and a second voltage lower than the first voltage, and
    wherein the negative voltage is lower than the second voltage.

4. The test method according to claim 3,
    wherein a control circuit deselects the word lines during a test and drives the low-potential side bit line of the bit line pair to the negative voltage level.

5. The test method according to claim 4, wherein the control circuit deselects the word lines in accordance with a test mode signal.

6. The test method according to claim 3, wherein a negative voltage generation circuit that is coupled to the low-potential side bit line to generate a negative voltage.

7. The test method according to claim 6, wherein the negative voltage generation circuit includes a capacitive element that generates a negative voltage in accordance with the potentials of bit lines in the selected column.

8. The test method according to claim 1, wherein the low-potential side bit line of the bit line pair in the selected column is driven to the negative voltage level when the semiconductor memory device is in a test mode.

9. The test method according to claim 1, wherein the low-potential side bit line of the bit line pair in the selected column is driven to the negative voltage level when the semiconductor memory device is in a test mode and not driven to the negative voltage level in a normal operational mode.

10. The test method according to claim 2, further comprising of deselecting the plurality of word lines during a test and driving the low-potential side bit line of the bit line pair to the negative voltage level.

11. The test method according to claim 2, wherein the low-potential side bit line of the first bit line pair in the selected column is driven to the negative voltage level when the semiconductor memory device is in a test mode.

12. The test method according to claim 2, wherein the low-potential side bit line of the first bit line pair in the selected column is driven to the negative voltage level when the semiconductor memory device is in a test mode and not driven to the negative voltage level in a normal operational mode.

13. The test method according to claim 2, further comprising of deselecting the plurality of first word lines during a test and driving the low-potential side bit line of the first bit line pair to the negative voltage level.

* * * * *